(12) United States Patent
Mögelin et al.

(10) Patent No.: US 10,947,108 B2
(45) Date of Patent: Mar. 16, 2021

(54) MICRO-ELECTROMECHANICAL TRANSDUCER

(71) Applicant: Sonion Nederland B.V., Hoofddorp (NL)

(72) Inventors: Raymond Mögelin, Hoofddorp (NL); Dion Ivo de Roo, Hoofddorp (NL); Frederik Cornelis Blom, Hoofddorp (NL); Alwin Fransen, Hoofddorp (NL); Pavlo Mulyar, Hoofddorp (NL); Peter Christiaan Post, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 0 days.

(21) Appl. No.: 15/852,164

(22) Filed: Dec. 22, 2017

(65) Prior Publication Data

US 2018/0186622 A1    Jul. 5, 2018

(30) Foreign Application Priority Data

Dec. 30, 2016   (EP) ..................................... 16207614

(51) Int. Cl.
| | | |
|---|---|---|
| B81B 3/00 | (2006.01) | |
| H04R 19/00 | (2006.01) | |
| H04R 19/01 | (2006.01) | |
| H04R 19/04 | (2006.01) | |

(52) U.S. Cl.
CPC ............ *B81B 3/007* (2013.01); *B81B 3/0045* (2013.01); *H04R 19/005* (2013.01); *H04R 19/01* (2013.01); *H04R 19/04* (2013.01); *B81B 2201/0257* (2013.01); *B81B 2201/0264* (2013.01); *H04R 2201/003* (2013.01)

(58) Field of Classification Search
CPC .................. B81B 3/007; B81B 3/0045; B81B 2201/0264; B81B 2201/0257; H04R 19/04; H04R 19/01; H04R 19/005; H04R 2201/003
See application file for complete search history.

(56) References Cited

U.S. PATENT DOCUMENTS

| 3,483,951 | A | | 12/1969 | Bonesho | |
|---|---|---|---|---|---|
| 3,728,562 | A | * | 4/1973 | Herson | ..................... H04R 1/22 310/326 |

(Continued)

FOREIGN PATENT DOCUMENTS

| DE | 102013222966 A1 | 5/2015 |
|---|---|---|
| JP | 2000314442 A | 11/2000 |

OTHER PUBLICATIONS

European Patent Office, Partial European Search Report in European Application No. EP 16207614, dated Jun. 22, 2017 (5 pages).

*Primary Examiner* — Oyesola C Ojo
(74) *Attorney, Agent, or Firm* — Nixon Peabody LLP

(57) ABSTRACT

A micro-electromechanical transducer including one or more moveable members, and a viscoelastic substance having a predetermined viscoelasticity, the viscoelastic substance being adapted to influence the response of the transducer in a predetermined manner. The micro-electromechanical transducer of the present invention may include a MEMS transducer, such as a MEMS microphone, a MEMS vibration sensor, a MEMS acceleration sensor, a MEMS receiver.

18 Claims, 21 Drawing Sheets

(56) References Cited

U.S. PATENT DOCUMENTS

| | | | |
|---|---|---|---|
| 4,969,534 A * | 11/1990 | Kolpe | H04R 25/456 |
| | | | 181/130 |
| 5,578,800 A * | 11/1996 | Kijima | H04R 7/20 |
| | | | 181/171 |
| 5,885,471 A | 3/1999 | Ruben | |
| 5,965,249 A | 10/1999 | Sutton | |
| 6,788,796 B1 | 9/2004 | Miles | |
| 6,831,577 B1 | 12/2004 | Furst | |
| 6,853,290 B2 | 2/2005 | Jorgensen | |
| 6,859,542 B2 * | 2/2005 | Johannsen | B82Y 30/00 |
| | | | 381/174 |
| 6,888,408 B2 | 5/2005 | Furst | |
| 6,914,992 B1 | 7/2005 | van Halteren | |
| 6,919,519 B2 | 7/2005 | Ravnkilde | |
| 6,930,259 B1 | 8/2005 | Jorgensen | |
| 6,943,308 B2 | 9/2005 | Ravnkilde | |
| 6,974,921 B2 | 12/2005 | Jorgensen | |
| 7,008,271 B2 | 3/2006 | Jorgensen | |
| 7,012,200 B2 | 3/2006 | Moller | |
| 7,062,058 B2 | 6/2006 | Steeman | |
| 7,062,063 B2 | 6/2006 | Hansen | |
| 7,072,482 B2 | 7/2006 | Van Doorn | |
| 7,088,839 B2 | 8/2006 | Geschiere | |
| 7,110,560 B2 | 9/2006 | Stenberg | |
| 7,110,565 B1 | 9/2006 | Engbert | |
| 7,136,496 B2 | 11/2006 | van Halteren | |
| 7,142,682 B2 | 11/2006 | Mullenbom | |
| 7,181,035 B2 | 2/2007 | van Halteren | |
| 7,190,803 B2 | 3/2007 | van Halteren | |
| 7,190,854 B1 | 3/2007 | Novotny | |
| 7,206,428 B2 | 4/2007 | Geschiere | |
| 7,221,767 B2 | 5/2007 | Mullenbom | |
| 7,221,769 B1 | 5/2007 | Jorgensen | |
| 7,227,968 B2 | 6/2007 | van Halteren | |
| 7,239,714 B2 | 7/2007 | de Blok | |
| 7,245,734 B2 | 7/2007 | Niederdraenk | |
| 7,254,248 B2 | 8/2007 | Johannsen | |
| 7,286,680 B2 | 10/2007 | Steeman | |
| 7,292,700 B1 | 11/2007 | Engbert | |
| 7,292,876 B2 | 11/2007 | Bosh | |
| 7,336,794 B2 | 2/2008 | Furst | |
| 7,376,240 B2 | 5/2008 | Hansen | |
| 7,403,630 B2 | 7/2008 | Jorgensen | |
| 7,415,121 B2 | 8/2008 | Mögelin | |
| 7,425,196 B2 | 9/2008 | Jorgensen | |
| 7,460,681 B2 | 12/2008 | Geschiere | |
| 7,466,835 B2 | 12/2008 | Stenberg | |
| 7,492,919 B2 | 2/2009 | Engbert | |
| 7,548,626 B2 | 6/2009 | Stenberg | |
| 7,657,048 B2 | 2/2010 | van Halteren | |
| 7,684,575 B2 | 3/2010 | van Halteren | |
| 7,706,561 B2 | 4/2010 | Wilmink | |
| 7,715,583 B2 | 5/2010 | Van Halteren | |
| 7,728,237 B2 | 6/2010 | Pedersen | |
| 7,809,151 B2 | 10/2010 | Van Halteren | |
| 7,822,218 B2 | 10/2010 | Van Halteren | |
| 7,899,203 B2 | 3/2011 | Van Halteren | |
| 7,912,240 B2 | 3/2011 | Madaffari | |
| 7,946,890 B1 | 5/2011 | Bondo | |
| 7,953,241 B2 | 5/2011 | Jorgensen | |
| 7,961,899 B2 | 6/2011 | Van Halteren | |
| 7,970,161 B2 | 6/2011 | van Halteren | |
| 8,050,444 B2 * | 11/2011 | Smith | H04R 1/1066 |
| | | | 381/370 |
| 8,098,854 B2 | 1/2012 | van Halteren | |
| 8,101,876 B2 | 1/2012 | Andreasen | |
| 8,103,039 B2 | 1/2012 | van Halteren | |
| 8,160,290 B2 | 4/2012 | Jorgensen | |
| 8,170,249 B2 | 5/2012 | Halteren | |
| 8,189,804 B2 | 5/2012 | Hruza | |
| 8,189,820 B2 | 5/2012 | Wang | |
| 8,223,996 B2 | 7/2012 | Beekman | |
| 8,233,652 B2 | 7/2012 | Jorgensen | |
| 8,259,963 B2 | 9/2012 | Stenberg | |
| 8,259,976 B2 | 9/2012 | van Halteren | |
| 8,259,977 B2 | 9/2012 | Jorgensen | |
| 8,280,082 B2 | 10/2012 | van Halteren | |
| 8,284,966 B2 | 10/2012 | Wilk | |
| 8,313,336 B2 | 11/2012 | Bondo | |
| 8,315,422 B2 | 11/2012 | van Halteren | |
| 8,331,595 B2 | 12/2012 | van Halteren | |
| 8,359,927 B2 * | 1/2013 | Hooper | G01L 19/0084 |
| | | | 73/721 |
| 8,369,552 B2 | 2/2013 | Engbert | |
| 8,379,899 B2 | 2/2013 | van Halteren | |
| 8,448,326 B2 * | 5/2013 | Sinclair | H04R 19/016 |
| | | | 29/594 |
| 8,509,468 B2 | 8/2013 | van Halteren | |
| 8,526,651 B2 | 9/2013 | Lafort | |
| 8,526,652 B2 | 9/2013 | Ambrose | |
| 8,905,808 B2 * | 12/2014 | Allemand | H01L 23/26 |
| | | | 445/29 |
| 2005/0097959 A1 | 5/2005 | Pike | |
| 2006/0093167 A1 | 5/2006 | Mogelin | |
| 2006/0227984 A1 * | 10/2006 | Sinclair | H04R 19/016 |
| | | | 381/174 |
| 2007/0235501 A1 * | 10/2007 | Heck | B81C 1/00293 |
| | | | 228/101 |
| 2010/0172521 A1 | 7/2010 | van Halteren | |
| 2011/0182453 A1 | 7/2011 | van Hal | |
| 2011/0189880 A1 | 8/2011 | Bondo | |
| 2011/0299708 A1 | 12/2011 | Bondo | |
| 2011/0299712 A1 | 12/2011 | Bondo | |
| 2011/0311069 A1 | 12/2011 | Ambrose | |
| 2012/0014548 A1 | 1/2012 | van Halteren | |
| 2012/0027245 A1 | 2/2012 | van Halteren | |
| 2012/0031185 A1 | 2/2012 | Classen | |
| 2012/0140966 A1 | 6/2012 | Mocking | |
| 2012/0155683 A1 | 6/2012 | van Halteren | |
| 2012/0155694 A1 | 6/2012 | Reeuwijk | |
| 2012/0168271 A1 | 7/2012 | Ryaboy | |
| 2012/0255805 A1 | 10/2012 | van Halteren | |
| 2013/0028451 A1 | 1/2013 | de Roo | |
| 2013/0136284 A1 | 5/2013 | van Hal | |
| 2013/0142370 A1 | 6/2013 | Engbert | |
| 2013/0163799 A1 | 6/2013 | Van Halteren | |
| 2013/0195295 A1 | 8/2013 | van Halteren | |
| 2013/0199295 A1 | 8/2013 | Hoefer | |
| 2013/0202134 A1 * | 8/2013 | Afshar | H04R 9/06 |
| | | | 381/151 |
| 2014/0084396 A1 * | 3/2014 | Jenkins | B81B 3/0021 |
| | | | 257/419 |
| 2014/0173863 A1 * | 6/2014 | Van Hoven | A61B 8/4483 |
| | | | 29/25.35 |
| 2015/0252799 A1 | 9/2015 | Roscher | |
| 2016/0277828 A1 * | 9/2016 | Oh | H04R 1/105 |
| 2016/0291050 A1 | 10/2016 | Ehrenpfordt | |
| 2016/0373871 A1 * | 12/2016 | Ronig | H04R 29/003 |
| 2017/0089942 A1 | 3/2017 | Chen | |
| 2017/0150771 A1 * | 6/2017 | Huh | A42B 3/12 |
| 2018/0014973 A1 * | 1/2018 | Echeverri | A61F 11/14 |
| 2018/0213311 A1 * | 7/2018 | Pahl | H04R 19/005 |

* cited by examiner

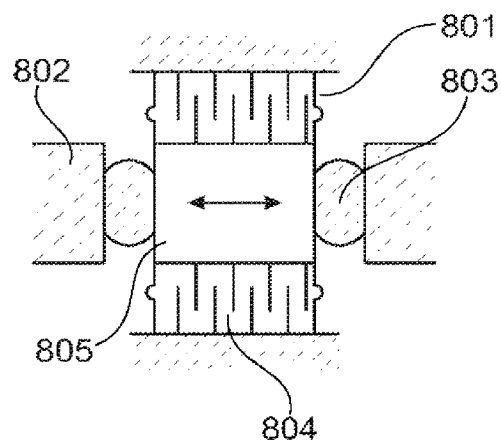
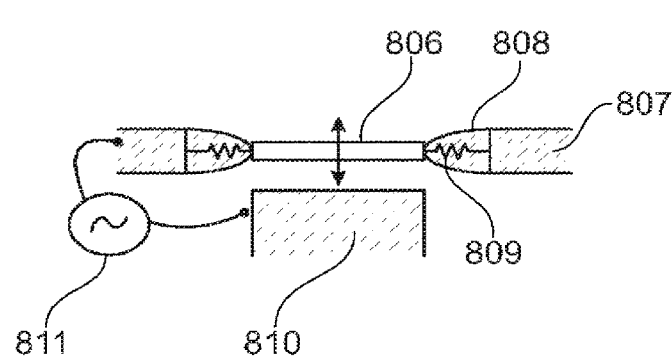
Fig. 8A                 Fig. 8B
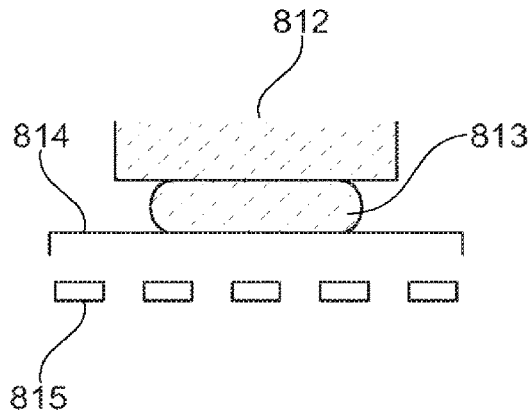
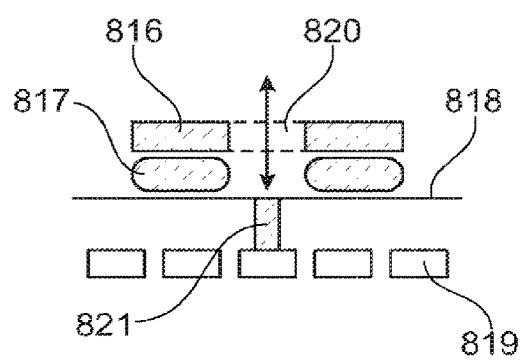
Fig. 8C                 Fig. 8D

MICRO-ELECTROMECHANICAL TRANSDUCER

CROSS-REFERENCE TO RELATED APPLICATIONS

This application claims the benefit of European Patent Application Serial No. 16207614.5, filed Dec. 30, 2016, which is incorporated herein by reference in its entirety.

FIELD OF THE INVENTION

The present invention relates to a micro-electromechanical transducer using a viscoelastic substance. The micro-electromechanical transducer of the present invention may for example be a micro-electromechanical system (MEMS) microphone, a MEMS vibration sensor, a MEMS acceleration sensor, a MEMS receiver, an electret microphone, an electret vibration sensor, or a balanced armature receiver. The viscoelastic substance may be a viscoelastic gel.

BACKGROUND OF THE INVENTION

In general, damping of movements of moveable masses can be achieved in various ways including squeeze film damping by air or fluid, viscoelastic damping by rubbers/plastics, electrostatic damping etc.

MEMS structures in the form of sensors, such as for example microphones, accelerometers and gyroscopes, as well as actuators, such as receivers, are usually very fragile. In addition, such MEMS structures have a low mass and they need a low stiffness to be sensitive enough. Damping in MEMS structures are therefore performed using low invasive methods like for example 1) electrostatic damping
2) squeeze film damping with either air or fluid Electrostatic damping is disadvantageous in that it requires extra electronic structures/electronics. Squeeze film damping with air requires very small and accurate distances between the damping surfaces. In addition, squeeze film damping with air may generate noise. Squeeze film damping with fluid, such as gas, requires a hermetic sealing which in many applications is disadvantageous.

The above-mentioned disadvantages imply that existing damping methods are not sufficient, or not possible to apply, in connection with modern and fragile MEMS structures due to for example insufficient damping, too much noise, too much influence on the movements etc. Therefore, there seems to be a need for a damping arrangement which can be applied in connection with fragile MEMS structures.

It may be seen as an object of embodiments of the present invention to provide a damping arrangement suitable for being used in connection with fragile transducer structures.

SUMMARY OF INVENTION

The above-mentioned object is complied with by providing, in a first aspect, a micro-electromechanical transducer comprising one or more moveable members, and
a viscoelastic substance having a predetermined viscoelasticity, wherein the viscoelastic substance is adapted to influence the response of the transducer in a predetermined manner.

As previously addressed the micro-electromechanical transducer of the present invention may be a MEMS transducer, such as a MEMS microphone, a MEMS vibration sensor, a MEMS acceleration sensor, or a MEMS receiver. The transducer of the present invention may also be an electret microphone, an electret vibration sensor, or a balanced armature receiver.

The response of the micro-electromechanical transducer may be influenced by influencing a movability, and thereby a response, of the one or more moveable members.

Reflow is an important issue in relation to modern manufacturing processes. In order to comply with such reflow-related demands the viscoelastic substance may be capable of withstanding temperatures of at least 80° C., such as at least 100° C., such as at least 120° C., such as at least 150° C., such as at least 200° C., such as at least 250° C., such as at least 300° C., such as at least 350° C., such as at least 400° C.

In order not to influence the electronics of the micro-electromechanical transducer, in particular in relation to sensors, the viscoelastic substance may have an impedance of at least 100 GΩ, such as at least 200 GΩ, such as at least 300 GΩ, such as at least 500 GΩ, such as at least 800 GΩ, such as at least 1 TΩ, such as at least 2 TΩ, such as at least 5 TΩ.

In order to provide sufficient damping, the viscoelastic substance may have a certain viscosity, i.e. it needs to have an internal friction to loose energy when being deformed. In most, but not all, applications, the elasticity of the viscoelastic substance may be as low as possible in order not to influence the total stiffness of the system. Both the stiffness and the internal friction may be determined by measurement on a rheometer. These parameters can be expressed as the Storage Modulus and the Loss Modulus, respectively.

The Loss Modulus of the viscoelastic substance may be larger than $1\times10^2$ Pa at 1 kHz, such as larger than $5\times10^2$ Pa, such as larger than $1\times10^3$ Pa, such as larger than $5\times10^3$ Pa, such as larger than $1\times10^4$ Pa, such as larger than $5\times10^4$ Pa, such as larger than $1\times10^5$ Pa in order to provided sufficient damping. The Storage Modulus of the viscoelastic substance may be smaller than $1\times10^6$ Pa at 1 kHz, such as smaller than $5\times10^5$ Pa, such as smaller than $1\times10^5$ Pa, such as smaller than $5\times10^4$ Pa, such as smaller than $1\times10^4$ Pa, such as smaller than $5\times10^3$ Pa, such as smaller than $1\times10^3$ Pa in order to ensure a low stiffness. The design (length, width, height) of the one or more damping elements may be adjusted to reach the required damping and stiffness with a variety of material properties.

The stiffness of the viscoelastic substance may be selected so that it is less than 50% of the stiffness of the undamped transducer, such as less than 40% of the stiffness of the undamped transducer, such as less than 25% of the stiffness of the undamped transducer, such as less than 10% of the stiffness of the undamped transducer. A method for determining the stiffness of the undamped transducer is addressed elsewhere in the text.

In particular in relation to sensors the viscoelasticity of the viscoelastic substance may be selected so as to damp a resonance peak of the transducer in a predetermined manner.

The one or more moveable members may, in particular in relation to sensors, form one or more flexible beam structures each comprising a hinged portion and free hanging portion. In order to influence the response of transducer the viscoelastic substance may be positioned so as to influence movements of at least one of the flexible beam structures. This may be achieved by influencing a free hanging portion of at least one of the flexible beam structures.

The viscoelastic substance may also be positioned so as to synchronise movements of a plurality of the flexible beam structures. By synchronising the movements of a plurality of the flexible beam structures the micro-electromechanical transducer may only show a single resonance peak.

Gaps may be provided between the flexible beam structures and/or between the flexible beams and a frame structure. In this case the viscoelastic substance may be arranged to seal at least part of these gaps in that this kind of sealing may move the low frequency roll off of the transducer towards lower frequencies.

The micro-electromechanical transducer of the present invention may further comprise a read-out arrangement for detecting movements of the one or more flexible beam structures. This read-out arrangement may comprise one or more piezoelectric elements, one or more piezoresistive elements, one or more stain gauges or one or more capacitive elements, such as biased plate capacitors, for detecting movements of the respective flexible beam structures.

The micro-electromechanical transducer may further comprise a mass structure for influencing the response of the transducer, the mass structure being at least partly held in position by the viscoelastic substance. The mass structure may be at least partly immersed into the viscoelastic substance.

In an alternative embodiment the one or more moveable members may comprise one or more suspended moveable masses, the one or more suspended moveable masses being at least partly suspended in the viscoelastic substance. Additional suspension members, such as spring based suspension elements, may optionally be provided as well. Furthermore, a read-out arrangement comprising one or more capacitive elements, such as biased plate capacitors, for detecting movements of the respective suspended moveable masses may be provided.

In a preferred embodiment of the micro-electromechanical transducer the one or more moveable members may comprise a hinged portion and a free hanging portion. In addition one or more moveable masses for influencing the response of the transducer may be provided. The one or more moveable masses may be secured to respective ones of the one or more moveable members. Each of the one or more moveable masses may comprise an opening in the form of a compensation hole being aligned with an opening in the moveable member to which a moveable mass is secured. As previously addresses gaps may be provided between the one or more movable members and a frame structure. The free hanging portion of the one or more moveable members may thus move relative to the frame structure. The viscoelastic substance may be arranged to seal at least part of these gaps. Moreover, the viscoelastic substance may be arranged to form one or more suspension members for at least one moveable member.

During manufacturing the viscoelastic substance may, while it is in an uncured state, be kept in position by vertical walls of the one or more moveable masses and the frame structure. Moreover, surface tension may be capable of maintaining the viscoelastic substance in the intended position until it cures. When the viscoelastic substance is cured it may form the one or more suspension members with sealing properties along the gaps.

The micro-electromechanical transducer according to the preferred embodiment may further comprise a read-out arrangement comprising one or more capacitive elements, such as biased plate capacitors. The read-out arrangement may form part of a MEMS microphone comprising a pressure sensing element and a processing circuit for processing signals from the pressure sensing element. The MEMS microphone may in principle be any type of MEMS microphone, such as an off-the-shelf type charged plate MEMS microphone.

The one or more moveable members, the one or more moveable masses and a proper amount of viscoelastic substance may form part of an add-on assembly to the MEMS microphone. The overall function of the add-on assembly is to convert mechanical movements of the micro-electromechanical transducer into pressure variations. These pressure variations propagate into the MEMS microphone and are thereby converted from pressure variations to electrical output signals.

In a second aspect the present invention relates to a micro-electromechanical transducer comprising
    a MEMS microphone,
    an add-on assembly secured to the MEMS microphone, said add-on assembly comprising
    a spacer secured to the MEMS microphone,
    a moveable member having a frame structure, said frame structure being secured to the spacer,
    a moveable mass being secured to the moveable member, said moveable mass comprising an opening in the form of a compensation hole being aligned with an opening in the moveable member,
    a viscoelastic substance having a predetermined viscoelasticity, wherein the viscoelastic substance forms a suspension member and a seal between the moveable member and the frame structure, and
    a cover secured to the spacer.

The MEMS microphone and the add-on assembly may be implemented as disclosed in relation to the preferred embodiment of the first aspect. Moreover, the properties of the viscoelastic substance may be as disclosed above.

Again, the overall function of the add-on assembly is to convert mechanical movements of the micro-electromechanical transducer into pressure variations. These pressure variations propagate into the MEMS microphone and are thereby converted from pressure variations to electrical output signals. In a third aspect the present invention relates to a sensor comprising a micro-electromechanical transducer according to the first aspect. In case of a vibration sensor the sensed vibrations may be detected via a direct sound impact on the moveable membrane, or vibrations may be detected via for example a shell or housing of the vibration sensor.

In a fourth aspect the present invention relates to a receiver comprising a micro-electromechanical transducer wherein the one or more moveable members may form at least one moveable membrane comprising a hinged portion and a free hanging portion. The at least one moveable membrane may be spatially off-set relative to a frame structure. The at least one off-set moveable membrane may have a membrane area that approximately equals or exceeds an opening in the frame structure. In case a punching technique has been applied to manufacture a spatially off-set moveable membrane the membrane area of the said moveable membrane approximately equals the opening in the frame structure. The viscoelastic substance may be arranged to form one or more suspension members for the at least one moveable membrane. Gaps may be provided between a plurality of moveable membranes and/or between one or more movable membranes and a frame structure. The viscoelastic substance may be arranged to seal at least part of these gaps. Finally, a drive module for moving the at least one moveable membrane may be provided. The drive module may comprise an armature motor.

BRIEF DESCRIPTION OF THE DRAWINGS

The present invention will now be explained in further details with reference to the accompanying figures, wherein FIGS. 4A and 4B show vibration sensors using a coherent viscoelastic substance, whereas FIG. 6A shows the use of additional venting holes, whereas FIGS. 8A, 8B, 8C and 8D show various transducer configurations.

Figure 1A:
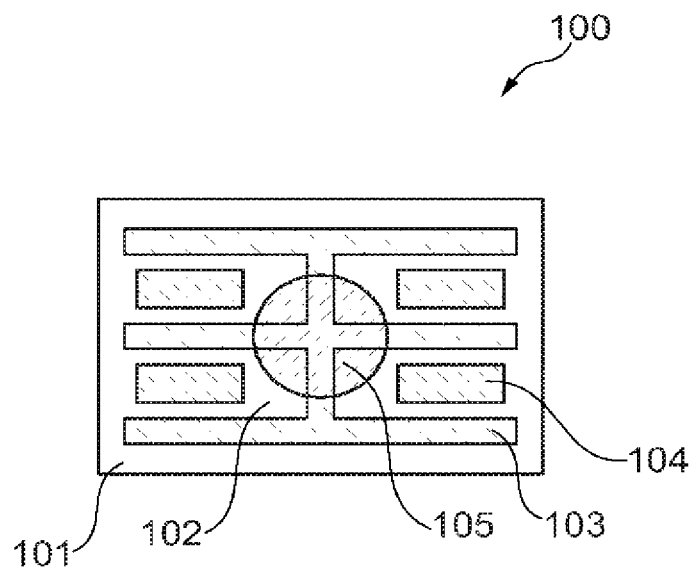
FIGS. 1A, 1B and 1C illustrate the principle of a damped response due to a viscoelastic substance.

While the invention is susceptible to various modifications and alternative forms specific embodiments have been shown by way of examples in the drawings and will be described in details herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In its most general aspect the present invention relates to a micro-electromechanical transducer applying a viscoelastic substance, such as a gel. The viscoelastic substance typically has a high viscosity and a low elasticity. The high viscosity of the viscoelastic substance provides the required damping of the substance, whereas the low elasticity ensures a low stiffness. The viscoelastic substance may also be used for sealing purposes only where both a low stiffness and a low damping are required.

The elasticity/stiffness and the viscosity/internal friction may be expressed in terms of the Storage Modulus and the Loss Modulus, respectively. Absolut values for both the Storage Modulus and the Loss Modulus are addressed elsewhere in the present application.

The micro-electromechanical transducer may in principle be any kind of transducer, including MEMS transducers, such as MEMS accelerometers, MEMS vibration sensors, MEMS microphones, MEMS receivers, or electret microphones, electret vibration sensors, or balanced armature receivers. The read-out mechanism of the sensors may involve capacitor based systems, including biased plate capacitors, piezoelectric elements, piezoresistive elements and stain gauges etc. The drive unit of the receiver may involve balanced armature based systems.

The properties of the viscoelastic substance are essential for the response of the micro-electromechanical transducer. Generally, the viscoelastic substance should be capable of being used between 0 and 50° C. and at relative humidity's between 10 and 90%. Moreover, the viscoelastic substance should operable at least at audio frequencies between 10 Hz and 20 kHz, such as between 100 Hz and 10 kHz. Finally, the properties of the viscoelastic substance should not significantly change under the influence of humidity, temperature, reflow (processing) temperatures, light, chemicals, magnetic/electric fields etc.

In relation to reflow, i.e. during manufacturing of the micro-electromechanical transducer, the viscoelastic substance should be capable of withstanding temperatures of at least 80° C., such as at least 100° C., such as at least 120° C., such as at least 150° C., such as at least 200° C., such as at least 250° C., such as at least 300° C., such as at least 350° C., such as at least 400° C.

Moreover, the viscoelastic substance should have an impedance in the frequency range of interest of the sensor, for example up to 20 kHz, of at least 100 GΩ, such as at least 200 GΩ, such as at least 300 GΩ, such as at least 500 GΩ, such as at least 800 GΩ, such as at least 1 TΩ, such as at least 2 TΩ, such as at least 5 TΩ in case the viscoelastic substance is applied in a sensor, such as microphone cartridge having a capacitance of around 1 pF.

As previously addressed the Loss Modulus of the viscoelastic substance may be larger than $1 \times 10^2$ Pa at 1 kHz, such as larger than $5 \times 10^2$ Pa, such as larger than $1 \times 10^3$ Pa, such as larger than $5 \times 10^3$ Pa, such as larger than $1 \times 10^4$ Pa, such as larger than $5 \times 10^4$ Pa, such as larger than $1 \times 10^5$ Pa in order to provided sufficient damping. The Storage Modulus of the viscoelastic substance may be smaller than $1 \times 10^6$ Pa at 1 kHz, such as smaller than $5 \times 10^5$ Pa, such as smaller than $1 \times 10^5$ Pa, such as smaller than $5 \times 10^4$ Pa, such as smaller than $1 \times 10^4$ Pa, such as smaller than $5 \times 10^3$ Pa, such as smaller than $1 \times 10^3$ Pa in order to ensure a low stiffness.

In terms of ranges the Loss Modulus is preferably in the range of $1 \times 10^2$ to $1 \times 10^7$ Pa at 1 kHz, whereas the Storage Modulus is preferably in the range of $1 \times 10^1$ to $1 \times 10^7$ Pa at 1 kHz.

As previously addressed the stiffness of the viscoelastic substance is preferably less than 50% of the stiffness of the undamped transducer, such as less than 40% of the stiffness of the undamped transducer, such as less than 25% of the stiffness of the undamped transducer or such as less than 10% of the stiffness of the undamped transducer. The stiffness of the undamped transducer may be determined by using the resonance frequency of the system and the weight of the moving mass. The resonance frequency may be determined by use of a laser Doppler vibrometer. The stiffness of an undamped transducer may be in the range of 5 to 20×10−15 m3/Pa for a microphone and in the range of 5 to 100×10−15 m3/Pa for a receiver. Other transducers designs may have a different range of stiffness.

Referring now to FIG. 1a a transducer in the form of a vibration sensitive element 100 is depicted. The vibration sensitive element comprises a frame structure 101 having four flexible beams 102 being integrated therewith. Alternatively, the four flexible beams 102 could be secured to the frame structure 101 using appropriate fastening means. The flexible beams 102 are separated by an opening 103, and each flexible beam 102 is thus free to move at least at one free hanging end. The frame structure 101 and the flexible beams 102 may be manufactured of for example silicon using a suitable MEMS manufacturing process. The free hanging end of each of the flexible beams 102 is allowed move, and thereby respond to incoming vibrations. This movement may be detected by various means such as piezoelectric elements 104 being either integrated with, or secured to each of the flexible beams 102. In order to damp a resonance peak of the sensitive element 100 a viscoelastic substance 105 is arranged so that it covers at least part of the flexible beams 102. In FIG. 1a the viscoelastic substance covers at least part of the free hanging ends of the flexible beams 102. As addressed above the viscoelastic substance may be a gel having a low stiffness and a high viscosity, wherein the high viscosity of the gel provides the required damping of the resonance peak, cf. FIG. 1c where the dashed line 111 shows a damped response, whereas the solid line 112 shows an undamped response. The achieved damping at the resonance peak is around 15 dB.

Figure 1B:
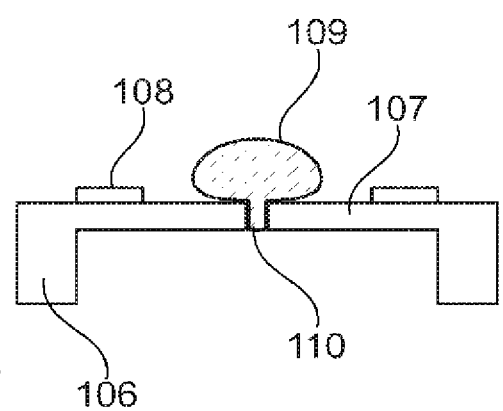
Figure 1C:
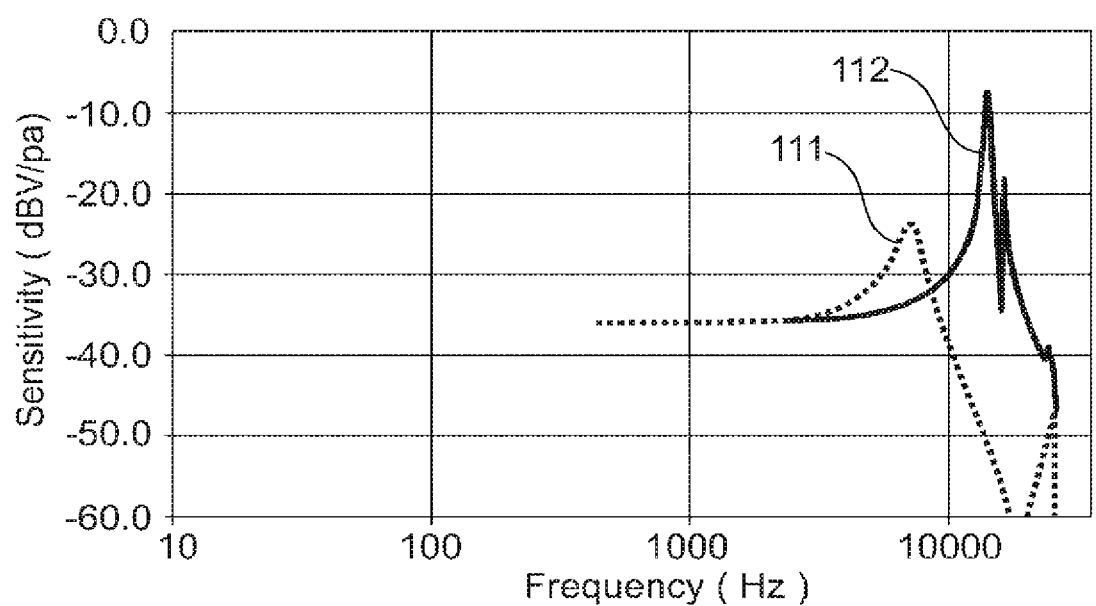

Referring now to FIG. 1b a cross-sectional view of the vibration sensitive element 100 is depicted. Thus, FIG. 1b shows the frame structure 106, the flexible beams 107, the piezoelectric elements 108 as well as the viscoelastic substance 109. The viscoelastic substance 109 fills the opening or gap 110 between the flexible beams 107.

Returning now to FIG. 1c the undamped response 112 (solid line) shows signatures of the individual resonance peaks from the respective flexible beams 102, 107. These individual resonance peaks are not seen in the damped response 111 (dashed line) due to the present of the viscoelastic substance.

Figure 2A:
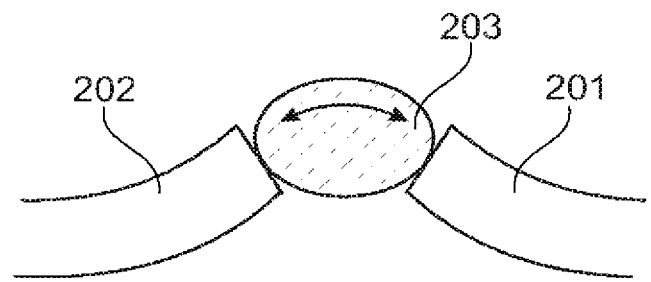
FIGS. 2A and 2B show the principles of stretch and shear damping.
Figure 2B:
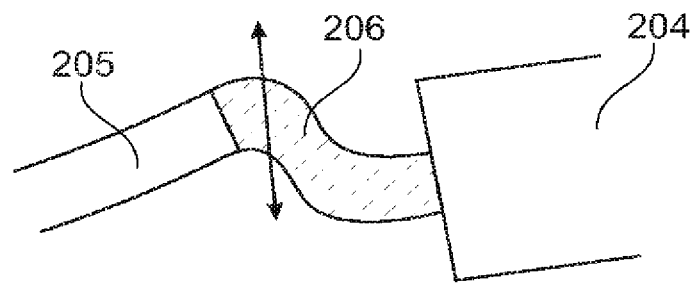

The type of damping being provided by the viscoelastic substance may be either stretch damping or shear damping. Stretch damping is illustrated in FIG. 2a where two flexible beams 201, 202 provide stretch to the viscoelastic substance 203 being arranged between the ends of the flexible beams 201, 202. Similarly, shear damping is illustrated in FIG. 2b where two beams 204, 205 provide shear to the viscoelastic substance 206 being arranged between the ends of the beams 204, 205.

In the vibration sensitive element 100 shown in FIG. 1a the dimensions of the frame structure 101 are 1×1 mm square including two, four or even more beams. The thickness of the frame structure is around 2 μm. The gaps between the beams are typically 0.5-1 μm. The gaps are sealed with a Q300 gel from Quantum Silicones. Other viscoelastic substances may however be applicable as well. The Q300 gel is capable of closing all the gaps, but this may not always be required. The thickness of the Q300 gel on top of the beams is typically 0.5-1 mm.

Figure 2C:
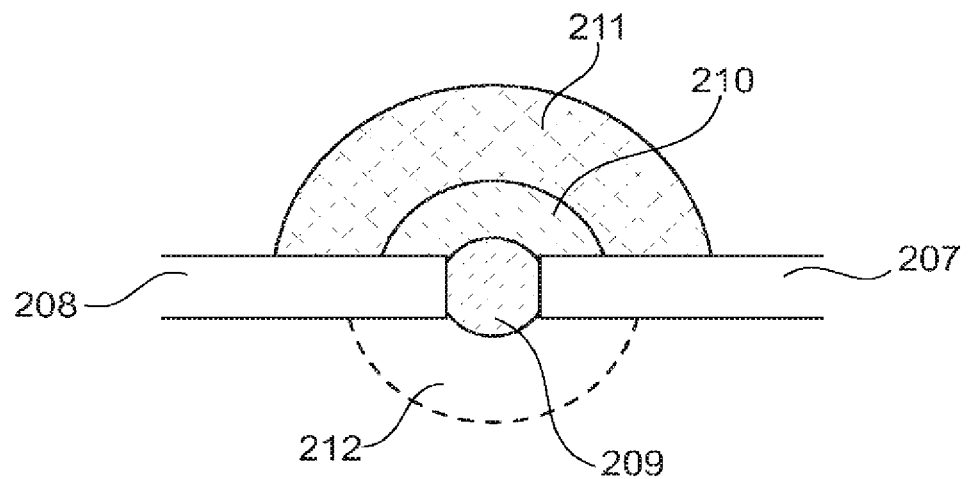
FIG. 2C illustrates various amounts of viscoelastic substances.

The amount of applied viscoelastic substance influences the level of damping in that a small amount of viscoelastic substance provides little damping, whereas a large amount of viscoelastic substance provides large damping. The various amounts of viscoelastic substance are illustrated in FIG. 2c where a small amount of viscoelastic substance 209 is arranged between beams 207, 208. If the amount of viscoelastic substance is increased 210, 211 and/or if the viscoelastic substance is applied on both sides of the beams 212 the achievable damping level is increased as well.

Figure 3A:
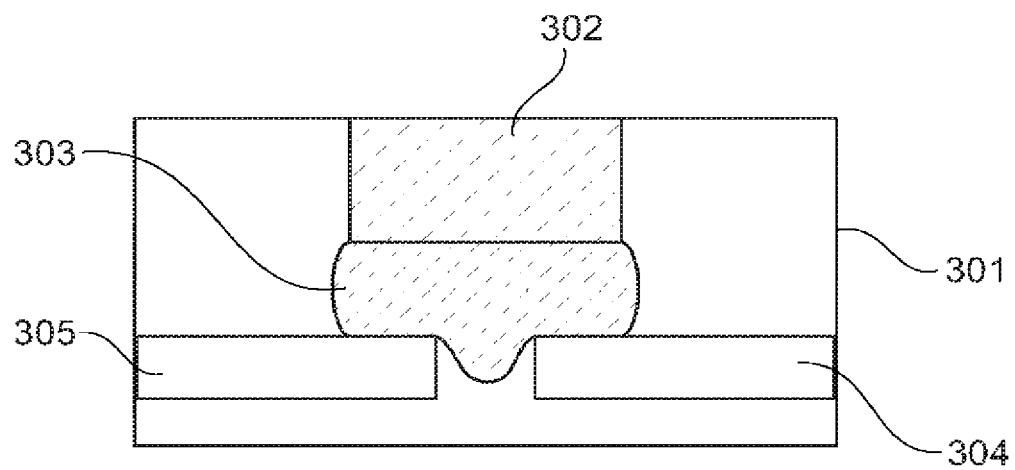
FIGS. 3A and 3B illustrate the appliance of a viscoelastic substance.
Figure 3B:
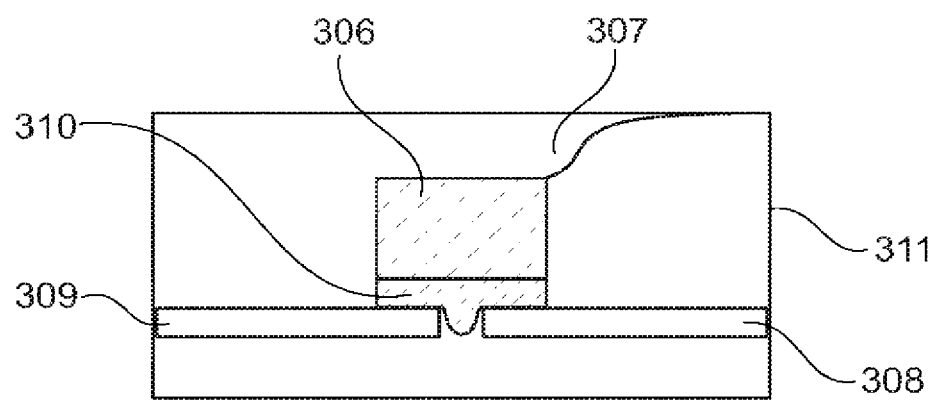

FIG. 3a shows a transducer embodiment where the viscoelastic substance 303 is arranged between two flexible beams 304, 305 and a fixture 302 being secured to a transducer casing 301. In FIG. 3b the fixture 306 is mechanically connected to the transducer casing 311 via a resilient member 307, such as a spring. Again, the viscoelastic substance 310 is arranged between the flexible beams 308, 309 and the fixture 306. The read-out mechanism (not shown) may for example involve piezoelectric elements, piezoresistive elements, stain gauges and/or capacitive means, such as a biased plate capacitor. In FIG. 3b the viscoelastic substance is allowed to at least partly fill out the opening or gap between the flexible beams 308, 309.

Figure 4A:
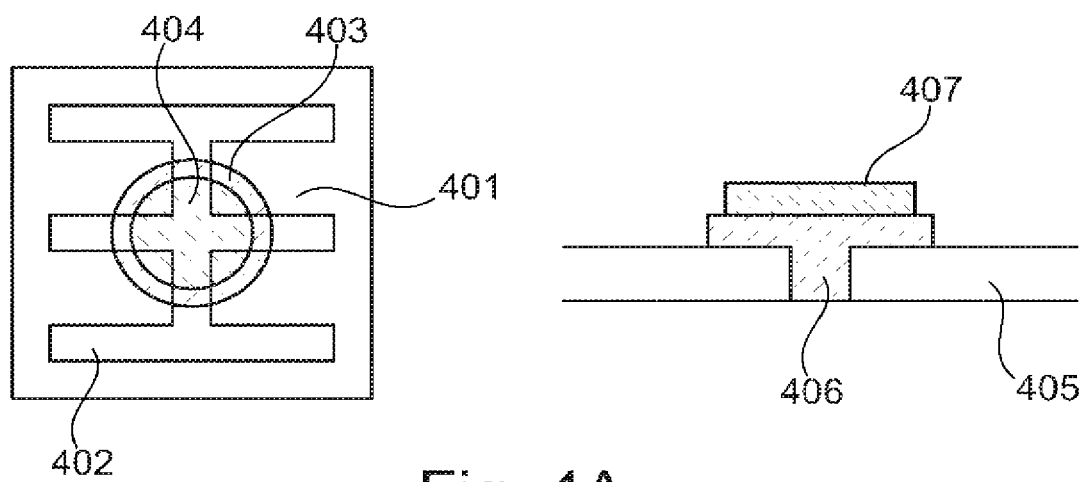

FIG. 4a shows a vibration transducer having four rectangular shaped flexible beams 401 being separated by gaps 402. The read-out mechanism is not shown. The four rectangular shaped flexible beams 401 may be formed in a silicon substrate using MEMS fabrication techniques. A viscoelastic substance 403 covers a centre portion of the substrate and a mass structure 404 is arranged on, and kept in position by, the viscoelastic substance 403. In the right hand side of FIG. 4a a rectangular shaped flexible beam 405, the viscoelastic substance 406 and the mass structure 407 are depicted in a cross-sectional view. The viscoelastic substance 406 fills out the gap between the rectangular shaped flexible beams 405 whereby the low frequency roll-off will be shifted towards lower frequencies. This will be explained in further details in connection with FIG. 5b.

Figure 4B:
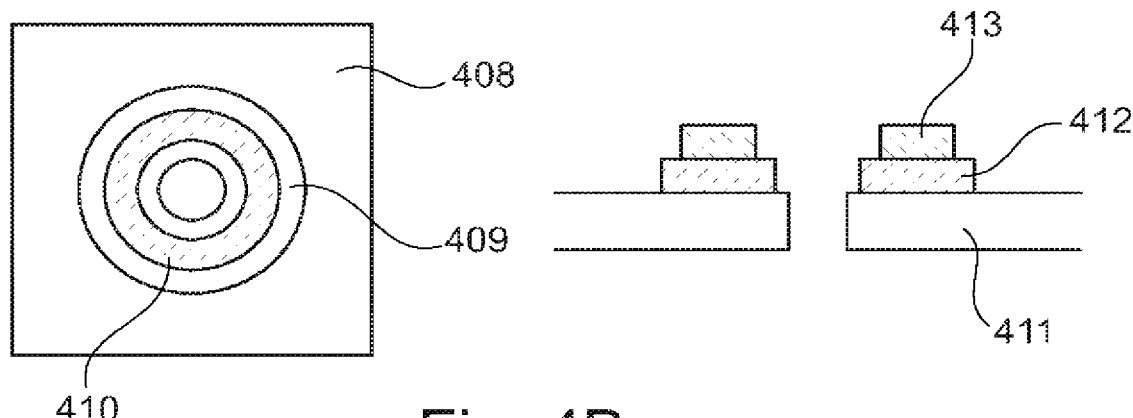

FIG. 4b shows another vibration transducer (read-out mechanism is not shown) having a circular shaped flexible beam 408 with a central opening. Again, the circular shaped flexible beam may be formed in a silicon substrate using MEMS fabrication techniques. A viscoelastic substance 409 covers an area around the central opening and a ring shaped mass structure 410 is arranged on, and kept in position by, the viscoelastic substance 409. In the right hand side of FIG. 4b a circular shaped flexible beam 411, the viscoelastic substance 412 and the ring shaped mass structure 413 is depicted in a cross-sectional view.

Figure 4C:
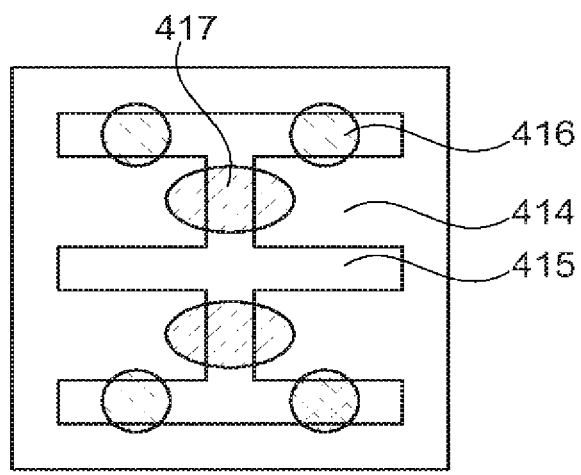
FIG. 4C shows the appliance of discrete portions of viscoelastic substances.

FIG. 4c shows a transducer (read-out mechanism is not shown) having four rectangular shaped flexible beams 414 being separated by gaps 415. The four rectangular shaped flexible beams 414 may be formed in a silicon substrate using MEMS fabrication techniques. Instead of providing a viscoelastic substance as a coherent substance the viscoelastic substance is applied as four discrete portions 416 in order to damp the respective resonance peaks of the individual rectangular shaped flexible beams. As depicted in FIG. 4c two discrete portions 417 of viscoelastic substance are applied to the respective free hanging portions of the flexible beams 414.

Figure 5A:
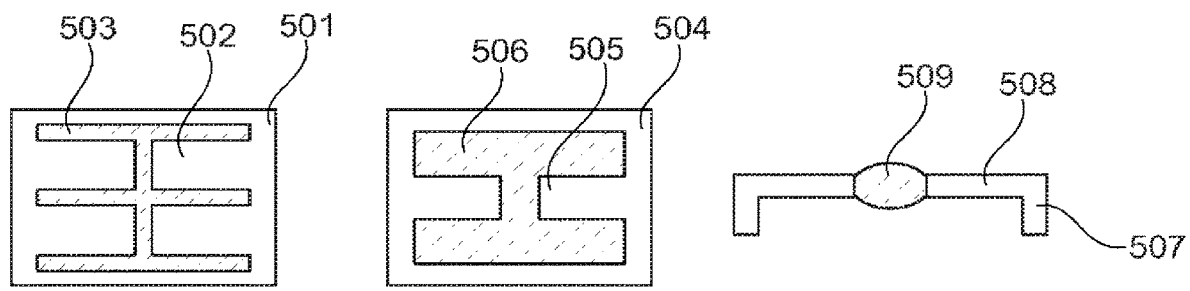
FIGS. 5A and 5B show low frequency roll-off at lower frequencies.
Figure 5B:
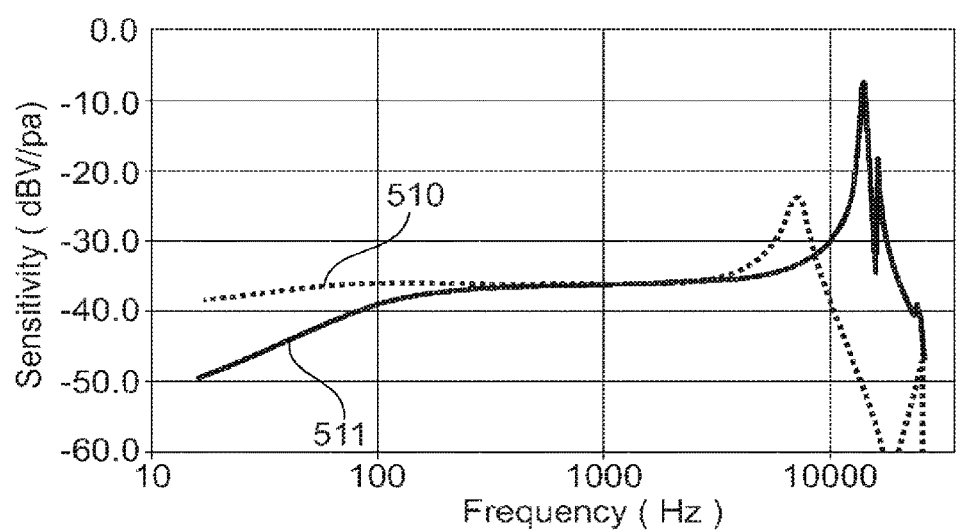

FIGS. 5a and 5b illustrate how a viscoelastic substance 503, 506, 509, when sealing the openings or gaps between flexible beams 502, 505, 508, moves the low frequency roll-off response towards lower frequencies, cf. the dashed line 510 in FIG. 5b. The flexible beams 502, 505, 508 in FIG. 5a are secured to, or integrated with, respective frame structures 501, 504, 507. In FIG. 5b the solid line 511 shows a response from an undamped system whereas the dashed line 510 shows a response from a damped system. In the damped system the resonance peak has been damped around 15 dB and the low frequency roll-off response has been shifted towards lower frequencies. Again, the read-out mechanism (capacitive, piezoelectric, piezoresistive, stain gauges etc.) has been omitted.

Figure 6A:
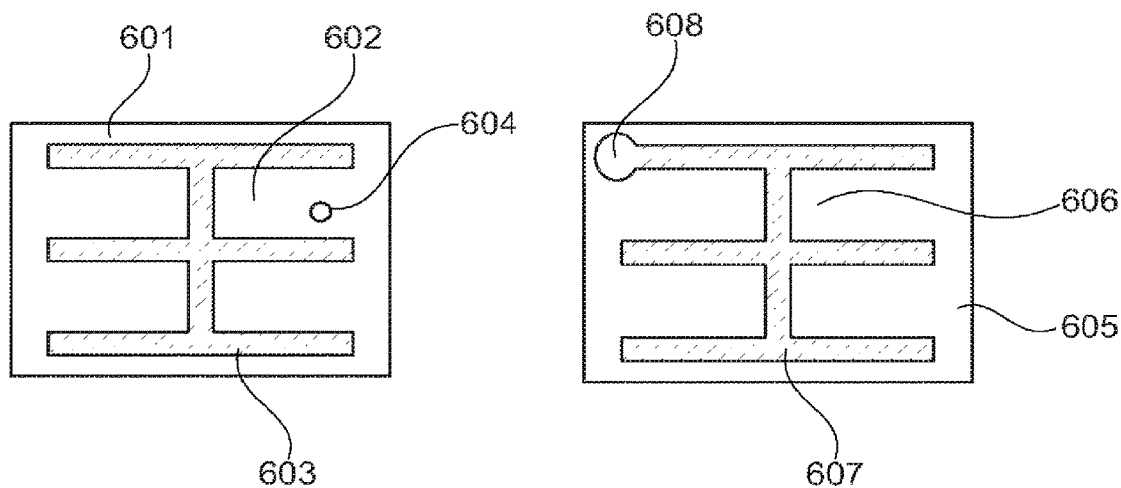

FIG. 6a also shows how a viscoelastic substance 603, 607 can seal the openings or gaps between flexible beams 602, 606 which are secured to, or integrated with, respective frame structures 601, 605. As seen in FIG. 6a predetermined compensation holes 604, 608 may be provided for air pressure relief through the frame structures 601, 605.

Figure 6B:
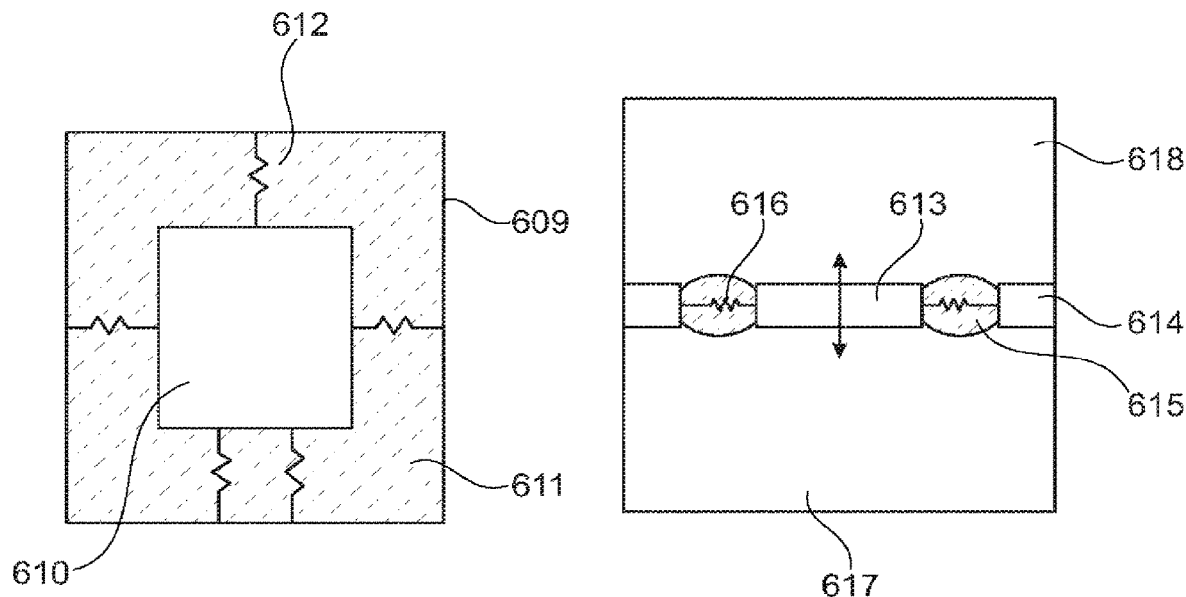
FIG. 6B shows alternative embodiments.

FIG. 6b shows alternative embodiments wherein suspended moveable masses have replaced flexible beams. As seen in FIG. 6b the moveable masses 610, 613 are each suspended in a number of suspension members 612, 616 which are secured to the moveable masses 610, 613 in one end, and to a fixture 609, 614 in the other end. In the left hand side of FIG. 6b a viscoelastic substance fills the volume between the moveable mass 610 and the casing 609. In the right hand side of FIG. 6b the viscoelastic substance 615 fills or seals the opening or gap between the moveable mass 613 and the fixture 614. The viscoelastic substance thereby seals the lower volume 617 from the upper volume 618. Thus, the viscoelastic substance can be used to seal volumes from each other. Again, the read-out mechanism (capacitive, piezoelectric, piezoresistive, stain gauges etc) has been omitted.

Figure 7A:
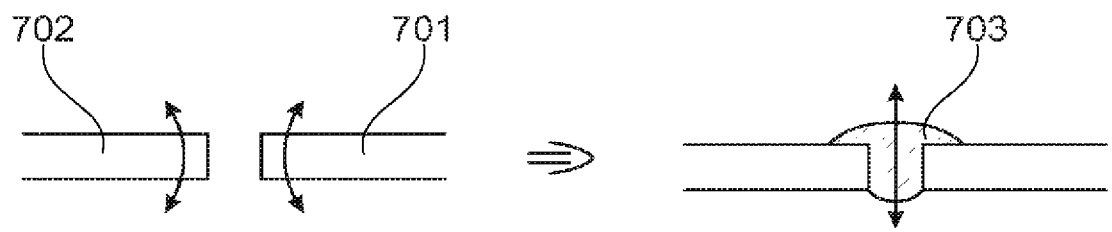
FIGS. 7A and 7B show the effect of connecting two or more moving structures resulting in movement in unison and, as a result, a single resonance peak.
Figure 7B:
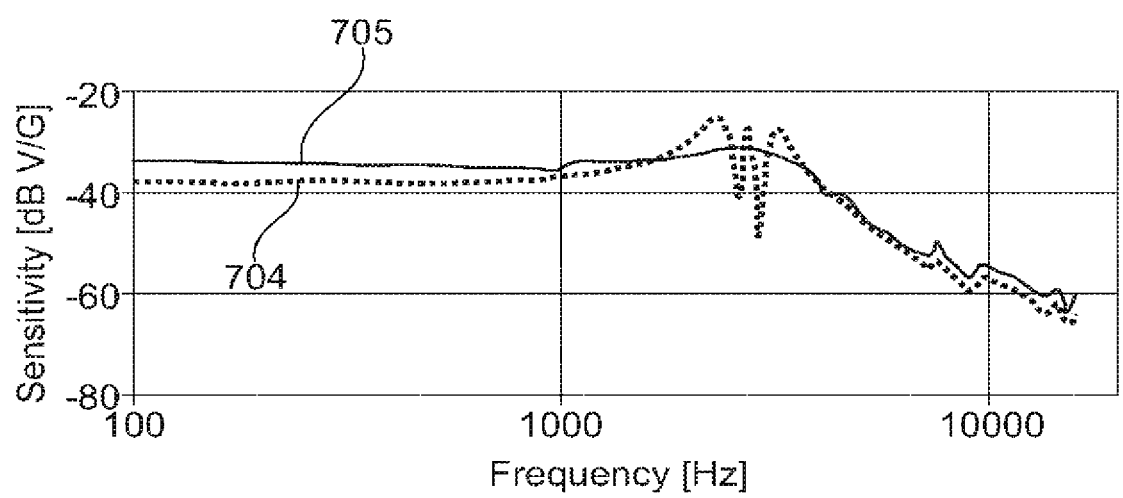

Turning now to FIG. 7a a pair of flexible beams 701, 702 is depicted. Due to minor mechanical tolerances the flexible beams 701, 702 might have slightly different resonance frequencies, and the flexible beams 701, 702 might thus respond differently to an incoming perturbation. However, if an appropriate amount of viscoelastic substance 703 is applied in an appropriate manner the deflections of the flexible beams can be synchronized so the system responds with only a single resonance peak. This is demonstrated in FIG. 7b where the dashed line 704 is the response of an undamped system, i.e. no viscoelastic substance is applied, whereas the solid line 705 shows the response of a damped system. As seen in FIG. 7b the dashed line 704 shows signatures of individual resonance peaks, whereas the solid line 705 shows only a single and common resonance peak.

FIG. 8 shows various embodiments of MEMS transducers. In FIG. 8a a MEMS accelerometer comprising a moveable mass 805 suspended in four suspension members 801 is depicted. The moveable mass 805 is adapted to move as indicated by the arrow. A viscoelastic substance 803 is provided on opposite sides of the moveable mass 805 between the moveable mass 805 and a pair of oppositely arranged fixtures 802. A capacitive read-out arrangement 804 is provided on both sides of the moveable mass 805 in order detect movements of the moveable mass 805 in response to incoming perturbations. In FIG. 8b an electrostatic actuator is depicted. The actuator comprises a moveable mass 806 being suspended in suspension members 809. A viscoelastic substance 808 is provided between the moveable mass 806 and a fixture 807 to which fixture 807 the suspension member 809 is also secured. A drive unit 811 is adapted to provide a drive signal between the moveable mass 806 and a back electrode 810 in order to move the moveable mass 806 in response to this drive signal. FIGS. 8c and 8d show various embodiments of a biased/electret capacitive microphone. In FIG. 8c a moveable membrane 814 is operatively connected to a fixture 812 via a viscoelastic substance 813. A fixed back plate 815 is provided below the moveable membrane 814. In FIG. 8d a moveable membrane 818 is operatively connected to a moveable mass 816 via a viscoelastic substance 817. The moveable mass 816 has a through-going opening 820. A fixed back plate 819 is provided below the moveable membrane 818. A centre support 821 for the moveable membrane 818 is provided. Again, the read-out mechanism (for example capacitive, piezoelectric, piezoresistive, stain gauges etc) has been omitted.

Figure 9A:
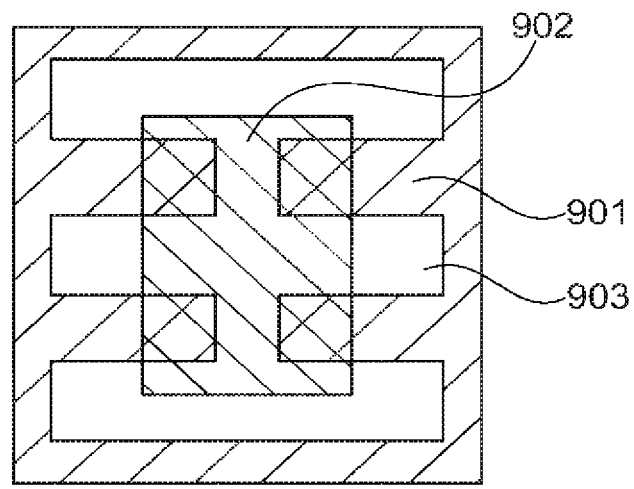
FIGS. 9A, 9B and 9C show various arrangements for limiting or confining the viscoelastic substance using surface tension or structural limitations.

Referring now to FIG. 9a the viscoelastic substance 902 may be kept in position by properly preparing four rectangular shaped flexible beams 901 with a predetermined material so that surface tension alone limits the extension of the viscoelastic substance 902 to a certain area. Generally, the viscoelastic substance may be brought onto the four rectangular shaped flexible beams 901, or a substrate, in a non-cured liquid form and kept in place by e.g. normal surface tension or capillary forces. The viscoelastic substance may then cure so that it maintains its position and keeps its form under all forces/circumstances. It should be noted however that some viscoelastic substances maintain a liquid form.

Figure 9B:
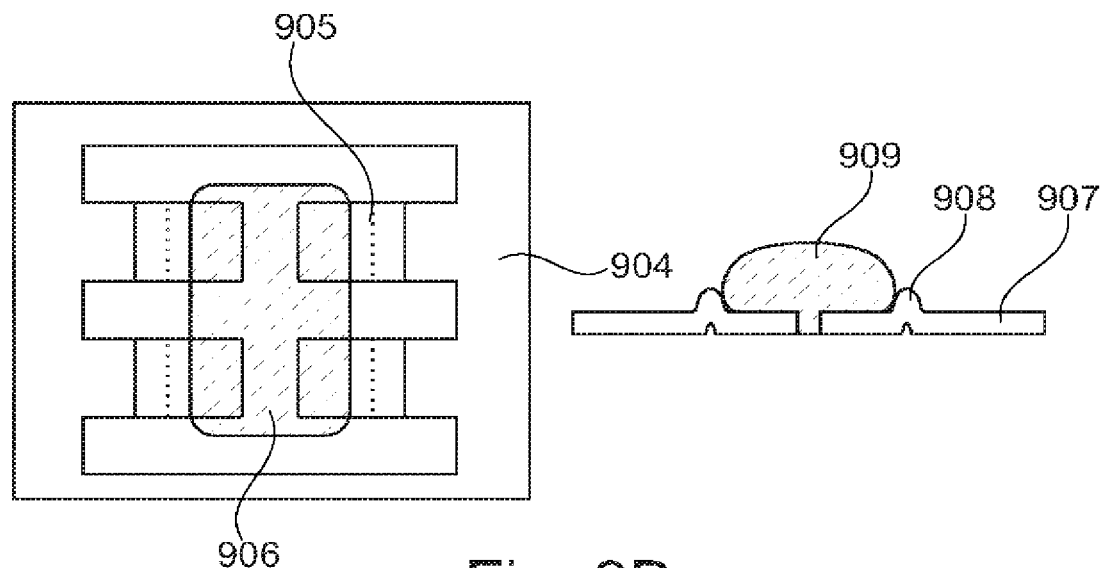
Figure 9C:
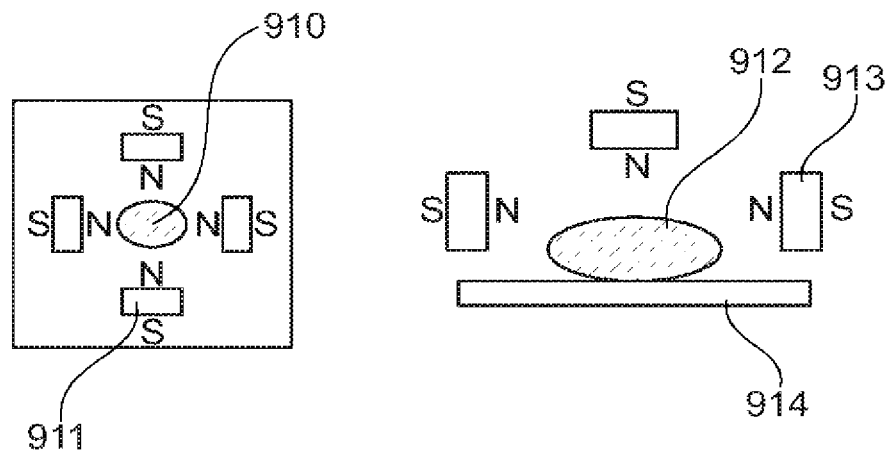

Suitable materials for limiting the extension of the viscoelastic substance 902 may involve for instance special high surface tension layers deposited on the silicon, such as silicon-oxide or silicon nitride. The configuration depicted in FIG. 9a is a transducer having four rectangular shaped flexible beams 901 being separated by gaps 903. In FIG. 9b a viscoelastic substance 906, 909 is restricted to an area by bumps 905, 908 integrated in the substrate 904, 907. As seen in FIG. 9b the viscoelastic substance 906, 909 seals a centre portion of the gaps between the four rectangular shaped flexible beams. In FIG. 9c a magnetic viscoelastic substance 910, 912 is kept in position by properly positioned magnets 911, 913. The magnetic viscoelastic substance 912 is arranged on a substrate 914 and an appropriate number of permanent magnets 913 are arranged around the magnetic viscoelastic substance 912 in order to keep the substance in a desired position. A suitable magnetic viscoelastic substance may for example be a ferrofluid.

Figure 10A:
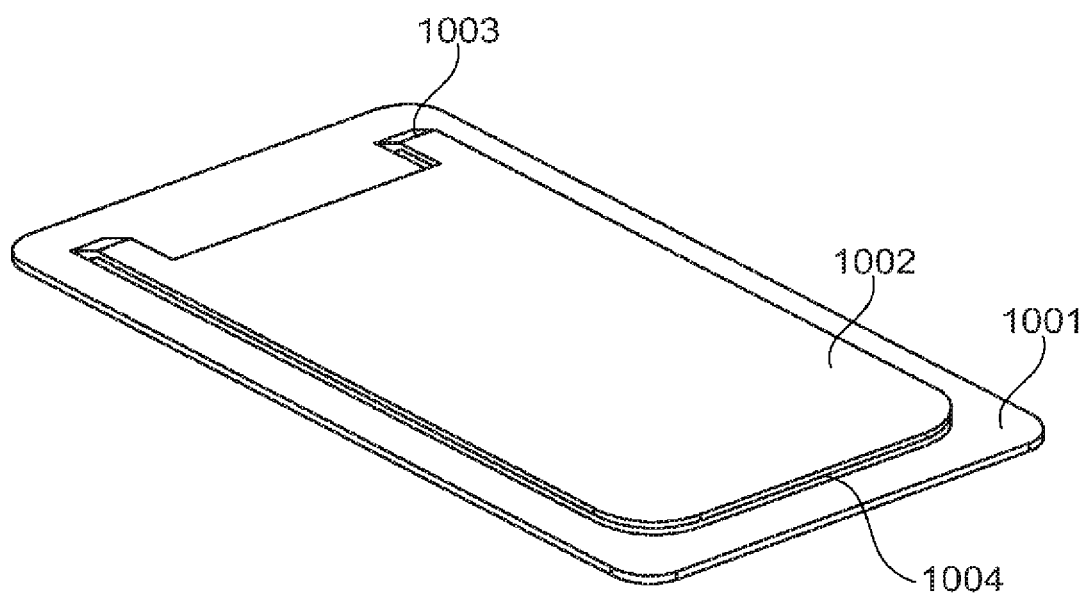
FIGS. 10A, 10B and 10C show a punched moveable membrane.

The embodiments shown in FIGS. 1-9 have mostly been related to sensors, including microphones, vibration sensors, acceleration sensors etc.. Turning now to FIG. 10a a punched moveable membrane 1002 of a receiver is depicted. The moveable membrane 1002 has been punched out of the frame structure 1001 to which frame structure 1001 the moveable membrane 1002 is still attached via two hinges 1003. The moveable membrane 1002 is therefore slightly offset relative to the frame structure 1001. The area of the punched membrane 1002 and the opening in the frame structure 1001 are comparable. This offset leaves an open slit 1004 between the moveable membrane 1002 and the frame structure 1001. The moveable membrane 1002 and the frame structure 1001 are made of the same material which may be an aluminium, stainless steel or nickel.

Figure 10B:
Figure 10C:
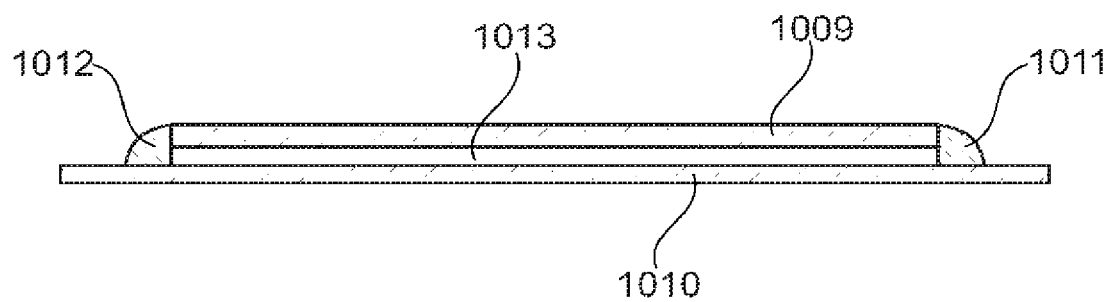

FIG. 10b shows a cross-sectional side view of the frame structure 1006, the moveable membrane 1005 and the open slit 1007 therebetween. In addition, the hinge 1008 attaching the moveable membrane 1005 to the frame structure is shown as well. In FIG. 10c, which shows a cross-sectional top view of the frame structure 1010, the moveable membrane 1009 and the open slit 1013 therebetween, a viscoelastic substance 1011, 1012 has been applied in the open slit

1013. The viscoelastic substance 1011, 1012 thereby forms a suspension member that suspends the moveable membrane 1009 relative to the frame structure 1010.

By sealing the open slit 1004, 1007, 1013 between the punched moveable membrane 1002, 1005, 1009 and the frame structure 1001, 1006, 1010 with the viscoelastic substance a reflowable moveable membrane having an intrinsic resonance peak damping is provided. By reflowable is meant that the viscoelastic substance is capable of withstanding the various temperatures involved in the manufacturing process of the receiver. Moreover, the open slit 1004, 1007, 1013 is acoustically sealed by the viscoelastic substance which typically has a low stiffness and a low viscosity thereby not influencing the receiver response. If a damping is required, a high viscosity of the viscoelastic substance can provide the required damping of the resonance peak of the moveable membrane. As addressed above, the viscoelastic substance can endure multiple reflow cycles without degrading, and compared to traditional foil-based suspension members, the viscoelastic substance will reduce the THD significantly, cf. FIGS. 11 and 12.

The moveable membrane in FIG. 10 is offset relative to the frame structure due to the applied punch technique. In this way a large membrane surface is created, and a offset provides a ridge against which the viscoelastic substance is easily applied. The viscoelastic substance may however also be applied in case the moveable membrane is not offset, such as in the case where an etched or laser cut moveable membrane is provided.

The moveable membrane may form part of a microelectromechanical transducer, such as a MEMS receiver, a balanced armature receiver or a MEMS vibration sensor. In case of a receiver a suitable drive unit for moving the moveable membrane is required. Similarly, in case of a vibration sensor a suitable read-out arrangement is required.

Figure 11A:
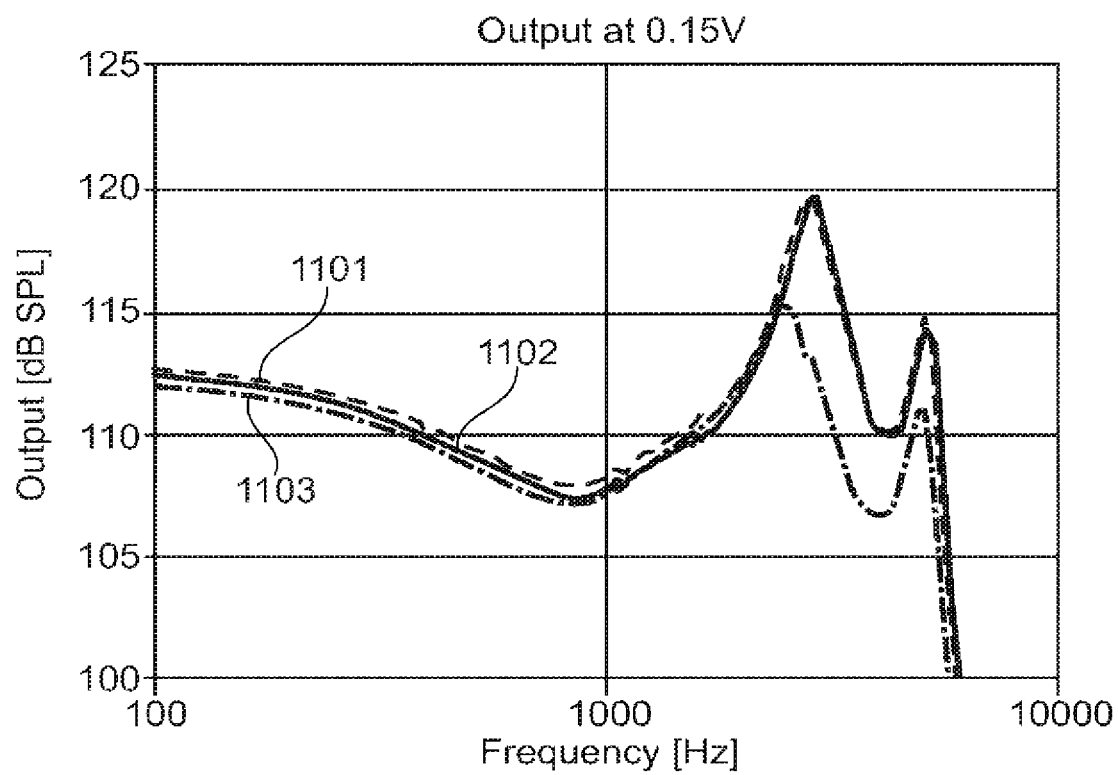
FIGS. 11A and 11B show response curves at a first signal level, FIGS. 12A and 12 B show response curves at a second signal level.
Figure 11B:
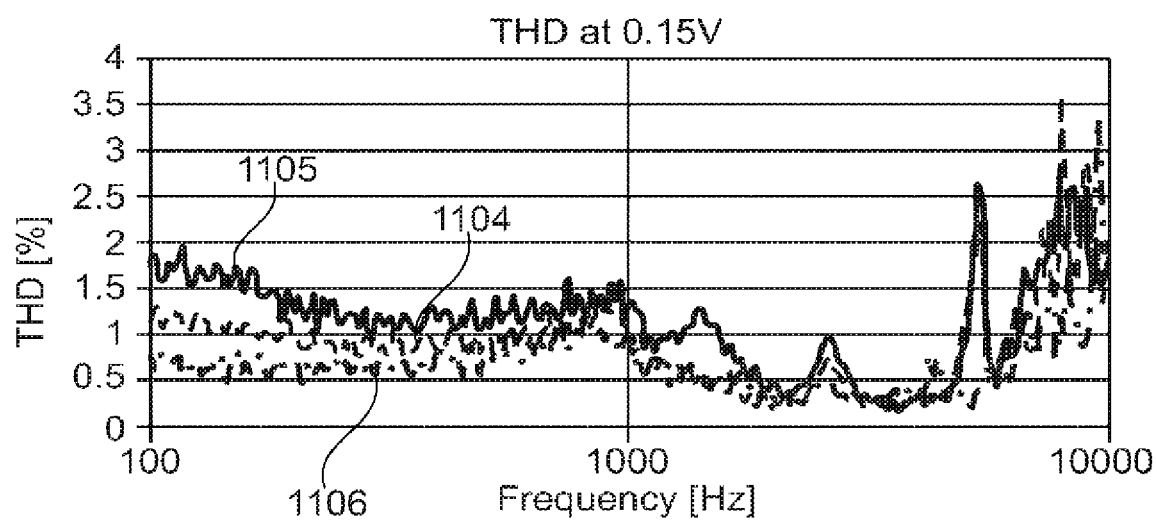
Figure 12A:
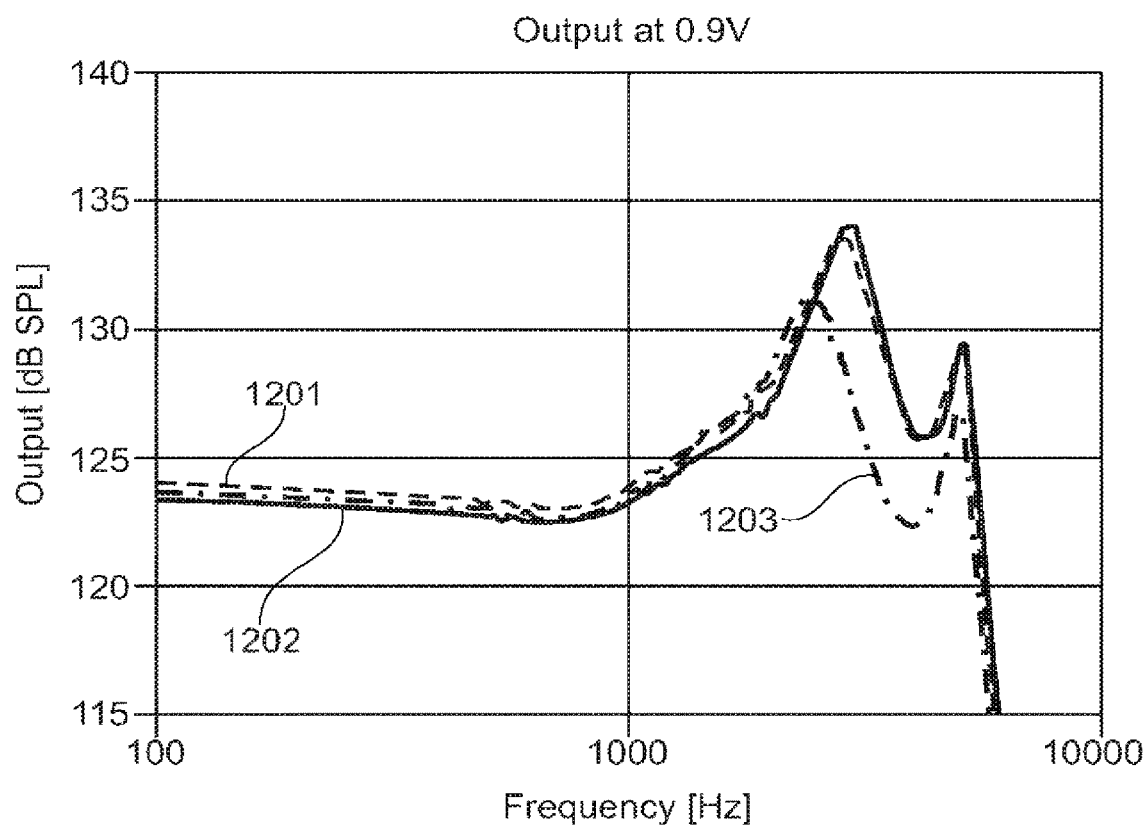
Figure 12B:
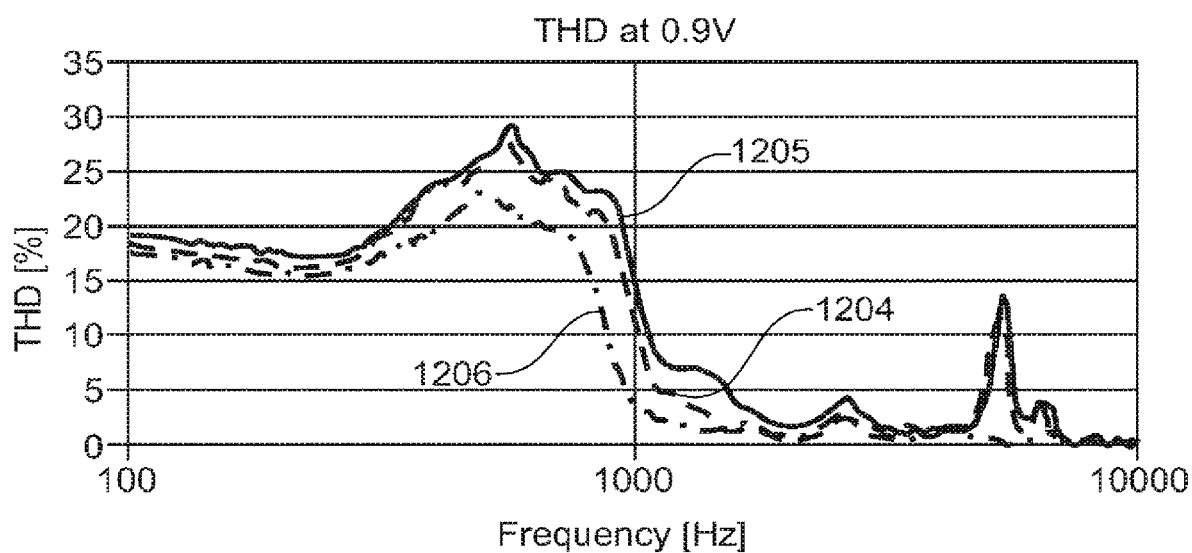

FIGS. 11 and 12 show receiver responses at two different signal levels—FIG. 11 at 0.15 V and FIG. 12 at 0.9 V. The responses from two traditional receivers and one receiver having a laser cut membrane suspended in a viscoelastic substance are shown in each of FIGS. 11 and 12.

In the upper part of FIG. 11 lines 1101, 1102 show the responses from the two undamped receivers. For comparison line 1103 shows the response of the receiver applying the viscoelastic substance. As seen in FIG. 11 the resonance peak has been lowered almost 5 dB due to the intrinsic damping. Also, the resonance peak has been shifted slightly towards the lower frequencies. Below the resonance peak the responses of the traditional receivers and the receiver having the intrinsic damping are approximately the same. In the lower part of FIG. 11 the THD from the three receivers are shown. As seen the THD from the receiver having the intrinsic damping 1106 is generally lower compared with the THD from the two traditional receivers 1104, 1105.

Regarding FIG. 12 lines 1201, 1202 show the responses from the two traditional receivers, whereas line 1203 shows the response of the receiver applying the viscoelastic substance. The resonance peak has been lowered almost 4 dB as well as being shifted slightly towards the lower frequencies due to the intrinsic damping. Below the resonance peak the responses of the traditional receivers and the receiver having the intrinsic damping are again approximately the same. In the lower part of FIG. 12 it is seen that the THD from the receiver having the intrinsic damping 1206 is generally lower compared with the THD from the two traditional receivers 1204, 1205.

Figure 13A:
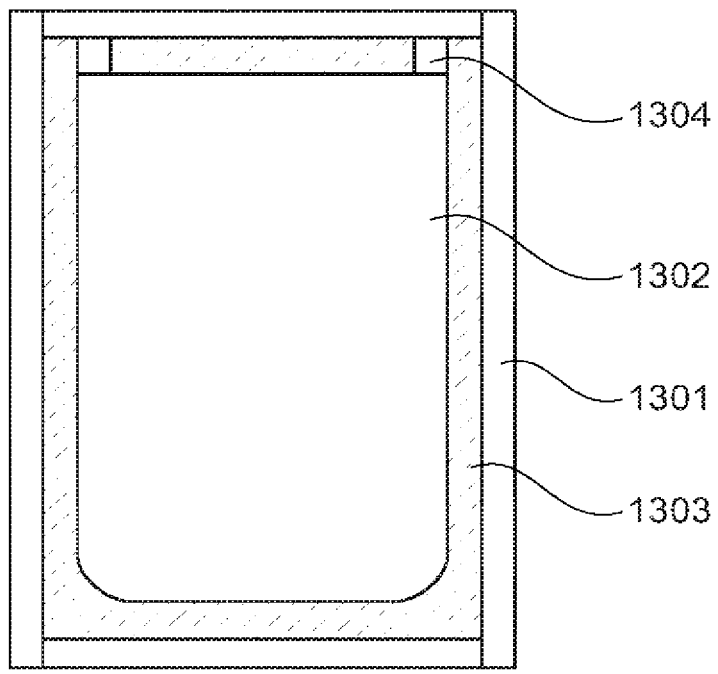
FIGS. 13A and 13B show top views of two receiver embodiments.
Figure 13B:
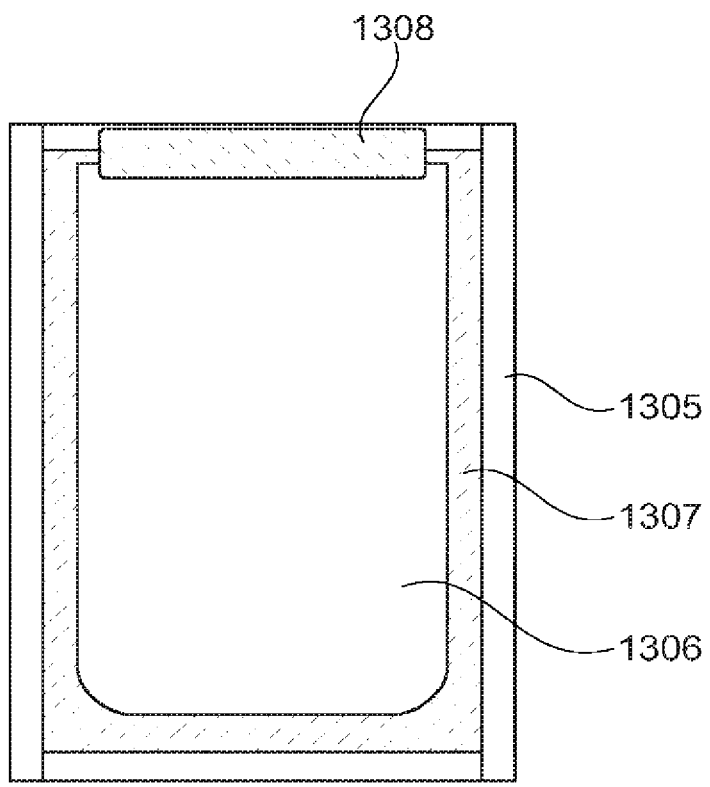

Referring now to FIG. 13a a top view of the punched moveable membrane of FIG. 10a is shown. Again, the frame structure 1301, the punched moveable membrane 1302, the viscoelastic substance 1303 and the two hinges 1304 are depicted. As the moveable membrane 1302 is a punched structure the membrane is made of the same material as the frame structure 1301. The moveable membrane 1302 and the frame structure 1301 may be made of for example aluminium, stainless steel or nickel. In FIG. 13b the moveable membrane 1306 is made of a different material than the frame structure 1305. For this reason a separate hinge arrangement 1308, such as an adhesive, between the moveable membrane 1306 and the frame structure 1305 is provided. The frame structure 1305 may be made of for example a Mu-metal, stainless steel or nickel, whereas the moveable membrane 1306 may be made of for example aluminium. The viscoelastic substance 1307 is provided between the frame structure 1305 and the moveable membrane 1306 and thus acts as a suspension member.

Figure 14A:
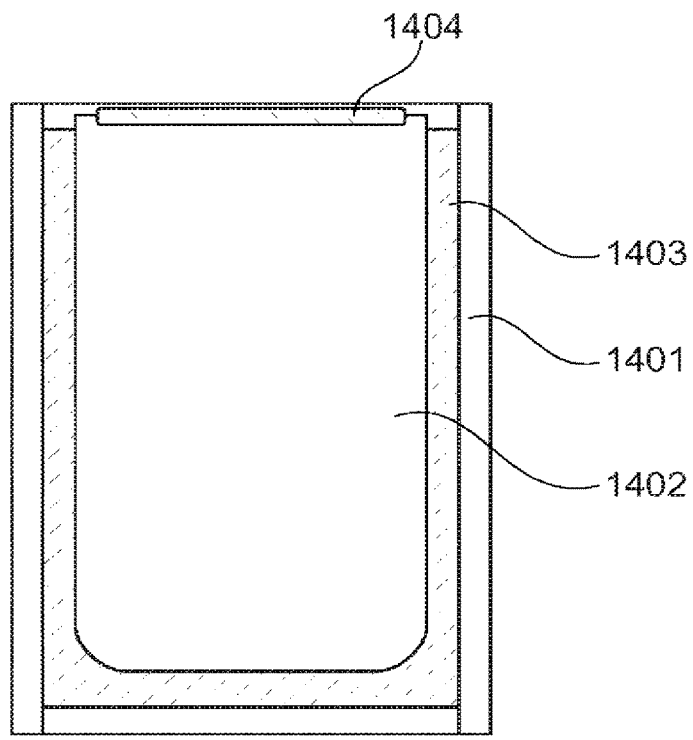
FIGS. 14A and 14B show top views of two receiver embodiments with enlarged membrane areas.

FIG. 14a shows an embodiment having an enlarged moveable membrane 1402 of a different material than the frame structure 1401. Compared to the area of the moveable membrane 1306, cf. FIG. 13b, the area of the moveable membrane 1402 is larger. Again, the frame structure 1401 may be made of for example a Mu-metal, stainless steel or nickel, whereas the moveable membrane 1402 may be made of for example aluminium. The viscoelastic substance 1403 is provided between the frame structure 1401 and the moveable membrane 1402. A separate hinge arrangement 1404, such as an adhesive, is provided between the moveable membrane 1402 and the frame structure 1401 alone the edge where the moveable membrane 1402 and the frame structure 1401 spatially overlaps.

Figure 14B:
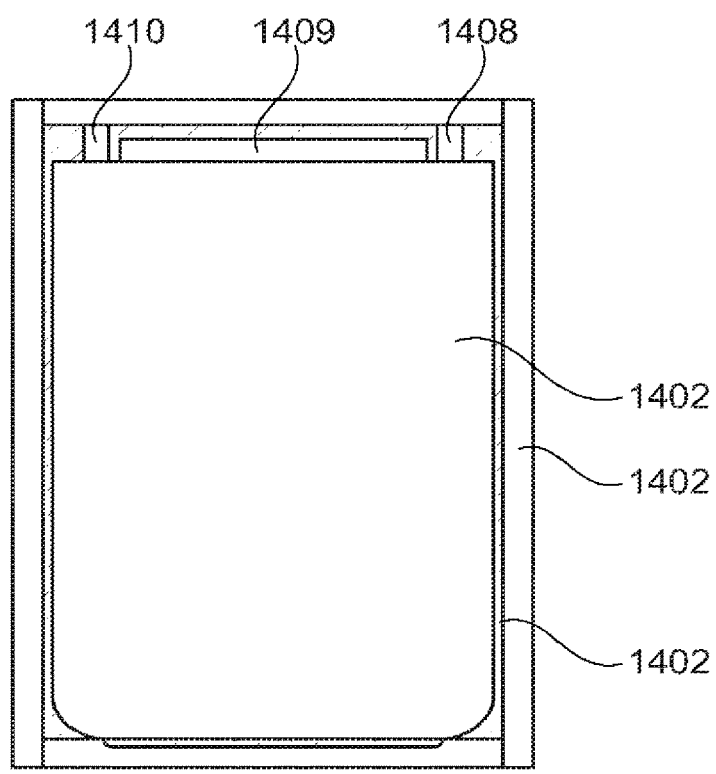

FIG. 14b shows an embodiment having an enlarged moveable membrane 1406. An enlarged moveable membrane is advantageous if a higher SPL is required. As seen in FIG. 14b the enlarged moveable membrane 1406 overlaps spatially with the frame structure 1405 along three edges. Moreover, the area of the moveable membrane 1406 has been increased by the additional area 1409. The frame structure 1405 as well as the moveable membrane 1406, 1409 may be made of for example a Mu-metal, stainless steel or nickel. The viscoelastic substance 1410 is provided between the frame structure 1406 and the moveable membrane 1405, 1409. Two integrated or discrete hinges 1408 is provided between the enlarged moveable membrane 1406, 1409 and the frame structure 1405.

Figure 15:
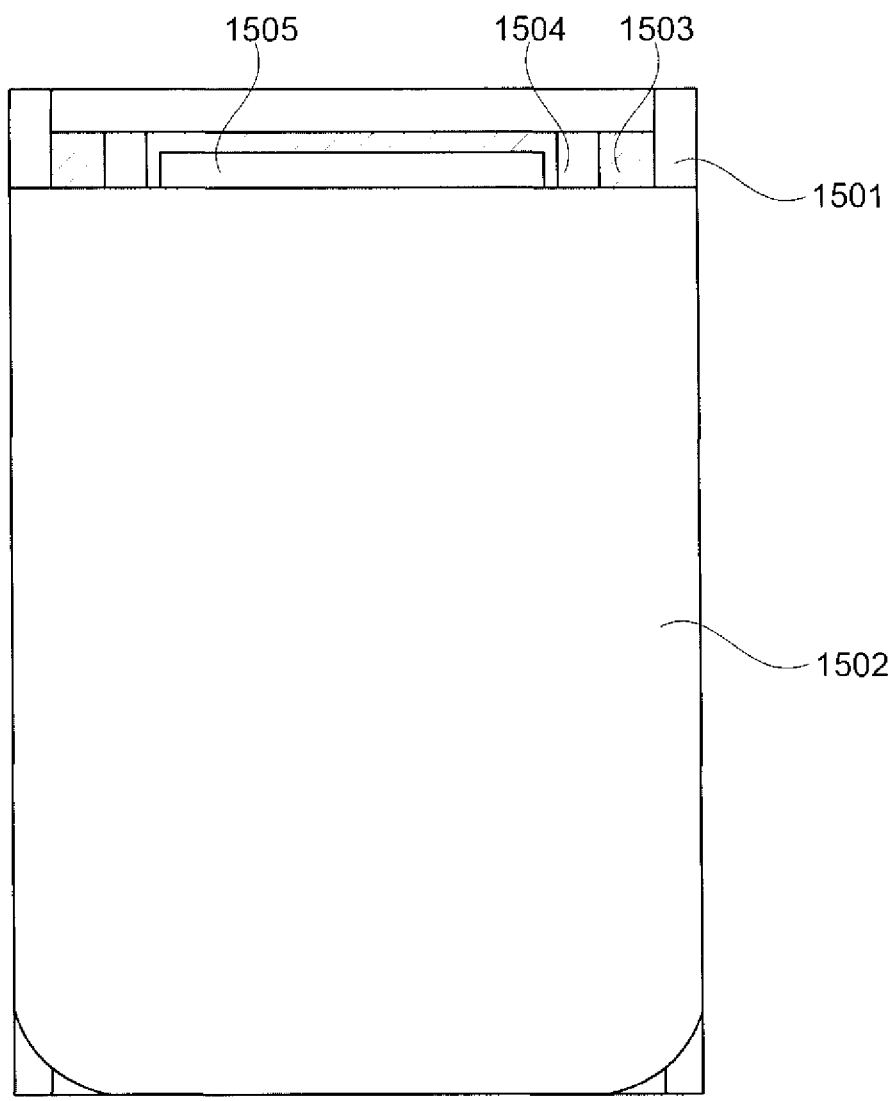
FIG. 15 shows a third receiver embodiment with enlarged membrane area.

The area of the moveable membrane shown in FIG. 14b has been further increased in FIG. 15 wherein the edges of the moveable membrane 1502 follows the outer boundaries of the frame structure 1501 on three sides. In principle, the edges of the moveable membrane 1502 may in fact exceed the outer boundaries of the frame structure 1501. Again, the area of the moveable membrane 1502 has been increased by also the additional area 1505. The viscoelastic substance 1503 is provided between the frame structure 1501 and the moveable membrane 1502, 1505. The frame structure 1501 as well as the moveable membrane 1502, 1505 may be made of for example a Mu-metal, stainless steel or nickel. Two integrated or discrete hinges 1504 are provided between the enlarged moveable membrane 1502, 1505 and the frame structure 1501.

FIG. 16 shows various embodiments of a moveable membrane relative to a housing or frame structure. With the exception of FIG. 16h all embodiments comprise a viscoelastic gel as the suspension substance. In the embodiment of FIG. 16h a fluid, such as silicone oil, is used as the suspension substance.

Figure 16C:
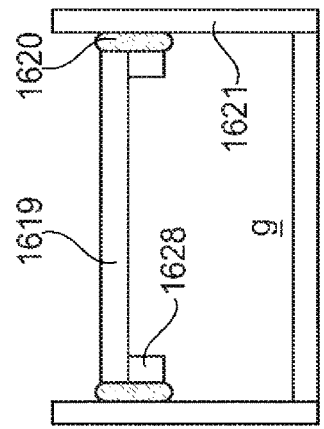
FIGS. 16A, 16B, 16C, 16D, 16E, 16F, 16G, 16H and 16I show various transducer suspension arrangements.
Figure 16F:
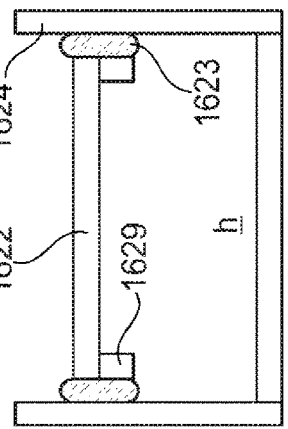
Figure 16I:
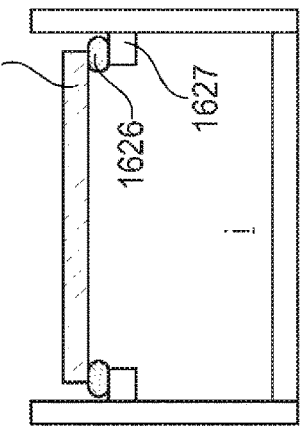
Figure 16B:
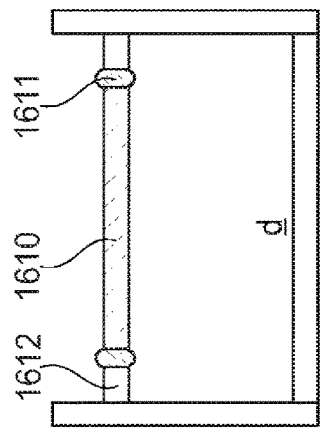
Figure 16E:
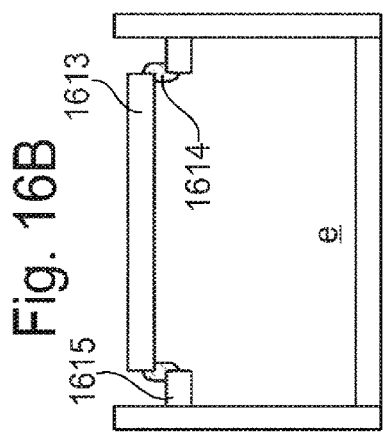
Figure 16H:
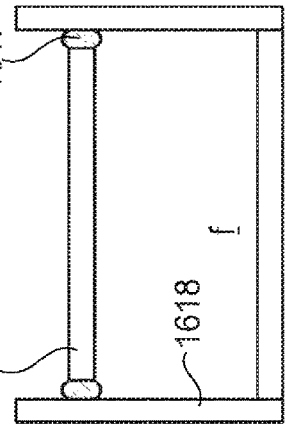
Figure 16A:
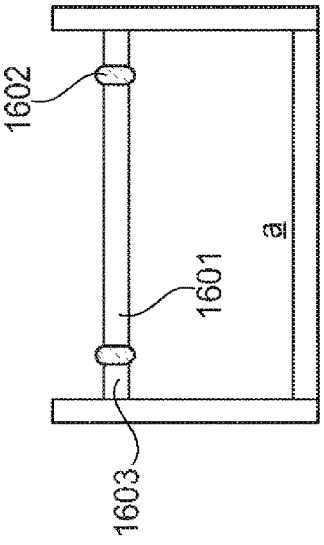

In FIG. 16a the moveable membrane 1601 is in line with the frame structure 1603 of the housing. The viscoelastic substance 1602 suspends the moveable membrane 1601. The moveable membrane 1601 and the frame structure 1603 are made of the same material which may include Mu-metal, stainless steel or nickel.

In FIG. 16b the moveable membrane 1604 is offset relative to the frame structure 1606 of the housing. The viscoelastic substance 1605 suspends the offset moveable membrane 1604 which is made of for example aluminium. The frame structure 1606 is made of the same material which may include Mu-metal, stainless steel or nickel.

FIG. 16c shows an enlarged moveable membrane 1607 which is offset relative to the frame structure 1609 of the housing. The viscoelastic substance 1608 is provided between the moveable membrane 1607 and the frame structure 1609. The moveable membrane 1607 and the frame structure 1609 are made of the same material which may include Mu-metal, stainless steel or nickel.

Figure 16D:
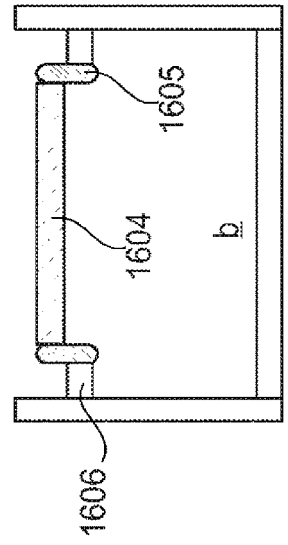

FIG. 16d is similar to FIG. 16a except that the moveable membrane 1610 and the frame structure 1612 are made of different materials. Thus, FIG. 16d shows an arrangement where the moveable membrane 1610 is in line with the frame structure 1612 of the housing. The viscoelastic substance 1611 suspends the moveable membrane 1610. The moveable membrane 1610 may be made of aluminium, whereas and the frame structure 1612 may be made of Mu-metal, stainless steel or nickel.

FIG. 16e shows an enlarged moveable membrane 1613 which is offset relative to the frame structure 1615 of the housing. The dimensions of the moveable membrane 1613 match the opening in the frame structure 1615. The viscoelastic substance 1614 is provided between the moveable membrane 1613 and the frame structure 1615. The moveable membrane 1613 and the frame structure 1615 are made of the same material which may include Mu-metal, stainless steel or nickel.

FIG. 16f shows an enlarged moveable membrane 1616 which is suspended directly in the walls 1618 of the housing. The viscoelastic substance 1617 is provided between the moveable membrane 1616 and the walls 1618 of the housing. The moveable membrane 1616 and the housing 1618 are made of the same material which may include Mu-metal, stainless steel or nickel.

Figure 16G:
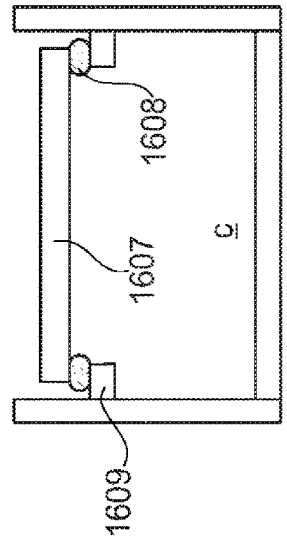

FIG. 16g also shows an embodiment having an enlarged moveable membrane 1619 which is suspended directly in the walls 1621 of the housing. A support structure 1628 is secured to the moveable membrane 1619 which increases the area facing the walls 1621 of the housing. Compared to FIG. 16f an enlarged amount of viscoelastic substance 1620 is provided between the moveable membrane/support structure 1619/1628 and the walls 1621 of the housing. The moveable membrane 1619 and the housing 1621 are made of the same material which may include Mu-metal, stainless steel or nickel.

FIG. 16h is similar to FIG. 17g except that a fluid, and not a gel, is applied to suspend the moveable membrane 1622. Thus, FIG. 16h shows an embodiment having an enlarged moveable membrane 1622 which is suspended directly in the walls 1624 of the housing. A support structure 1629 is secured to the moveable membrane 1612 which increases the area facing the walls 1624 of the housing. This increased area facilitates that an enlarged amount of fluid 1623, such as silicone oil, may be provided between the moveable membrane/support structure 1622, 1629 and the walls 1624 of the housing. The moveable membrane 1622 and the housing 1624 are made of the same material which may include Mu-metal, stainless steel or nickel.

FIG. 16i is similar to FIG. 16c except that the moveable membrane 1625 and the frame structure 1627 of the housing are made of different materials. Thus, FIG. 16i shows an enlarged moveable membrane 1625 which is offset relative to the frame structure 1627 of the housing. The viscoelastic substance 1626 is provided between the moveable membrane 1625 and the frame structure 1627. The moveable membrane 1625 may be made of aluminium, whereas the frame structure 1627 may be made of Mu-metal, stainless steel or nickel.

FIGS. 17-20 show a micro-electromechanical transducer according to an embodiment of the present invention. The micro-electromechanical transducer shown in FIGS. 17-20 and disclosed in further details below applies the above-mentioned generic principle of using a viscoelastic substance for damping and sealing purposes. It should be noted however that other implementations of the micro-electromechanical transducer may be available without departing from the overall scope of the present invention.

Figure 17A:
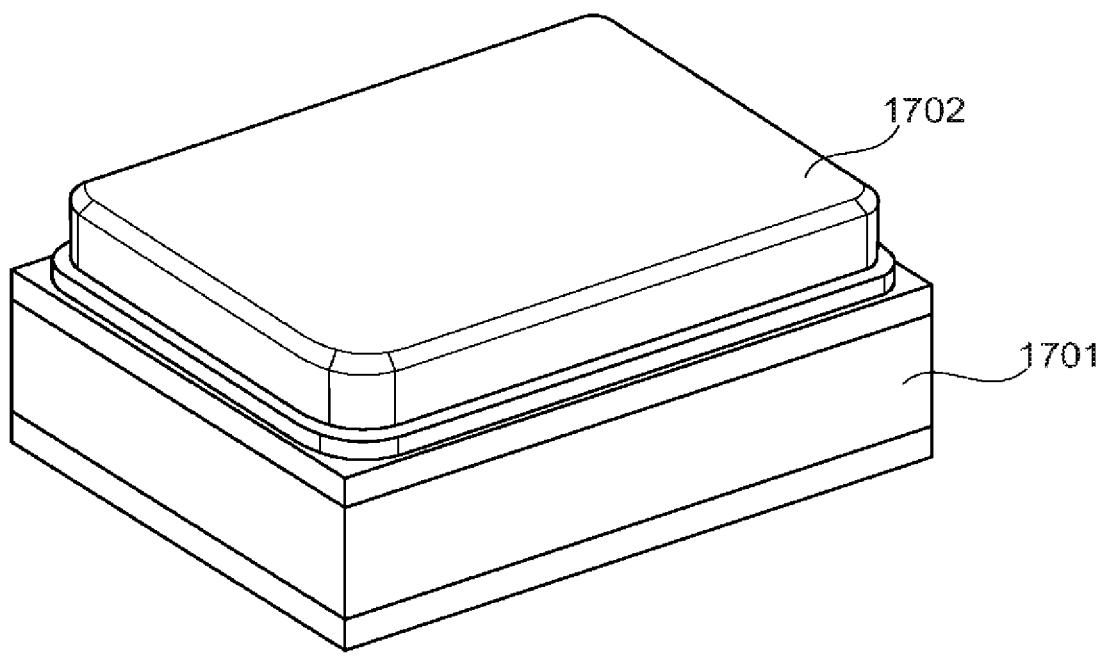
FIGS. 17A and 17B show views of an assembled micro-electromechanical transducer.
Figure 17B:
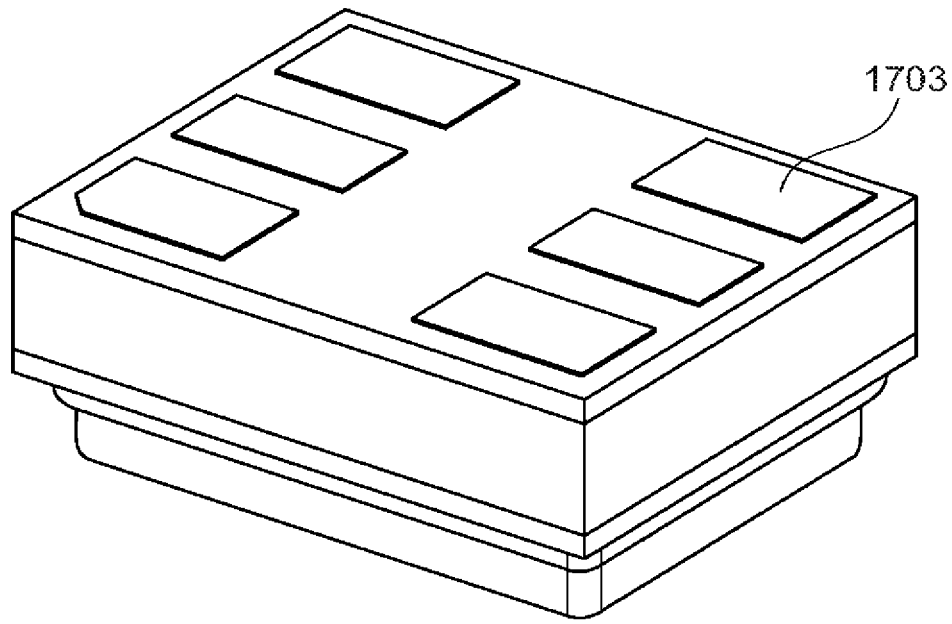

Referring now to FIG. 17a an assembled micro-electromechanical transducer comprising a MEMS microphone 1701 and cover 1702 secured thereto is depicted. The MEMS microphone may be an off-the-shelf type MEMS microphone comprising a pressure sensing element, such as a charged plate microphone, and a processing circuit, such as an application specific integrated circuit (ASIC), for processing signals from the pressure sensing element. The cover 1702 may be made of metal. As shown in FIG. 17b a number of contact pads 1703 are provided on a bottom surface of the MEMS microphone 1701 in order to provide electrical access to and from in particular the ASIC. As it will be demonstrated below a number of components, such as a spacer, a moveable member, a moveable mass, a disc as well as a proper amount of viscoelastic substance is hidden below the cover 1702. These components, i.e. the spacer, the moveable member, the moveable mass, the disc, the proper amount of viscoelastic substance and the cover 1702 surrounding these components, are to be considered as an add-on assembly to the MEMS microphone 1701. The overall function of the add-on assembly is to convert mechanical movements of the transducer into pressure variations. These pressure variations propagate into the MEMS microphone and are thereby converted from pressure variations to electrical output signals.

Figure 18:
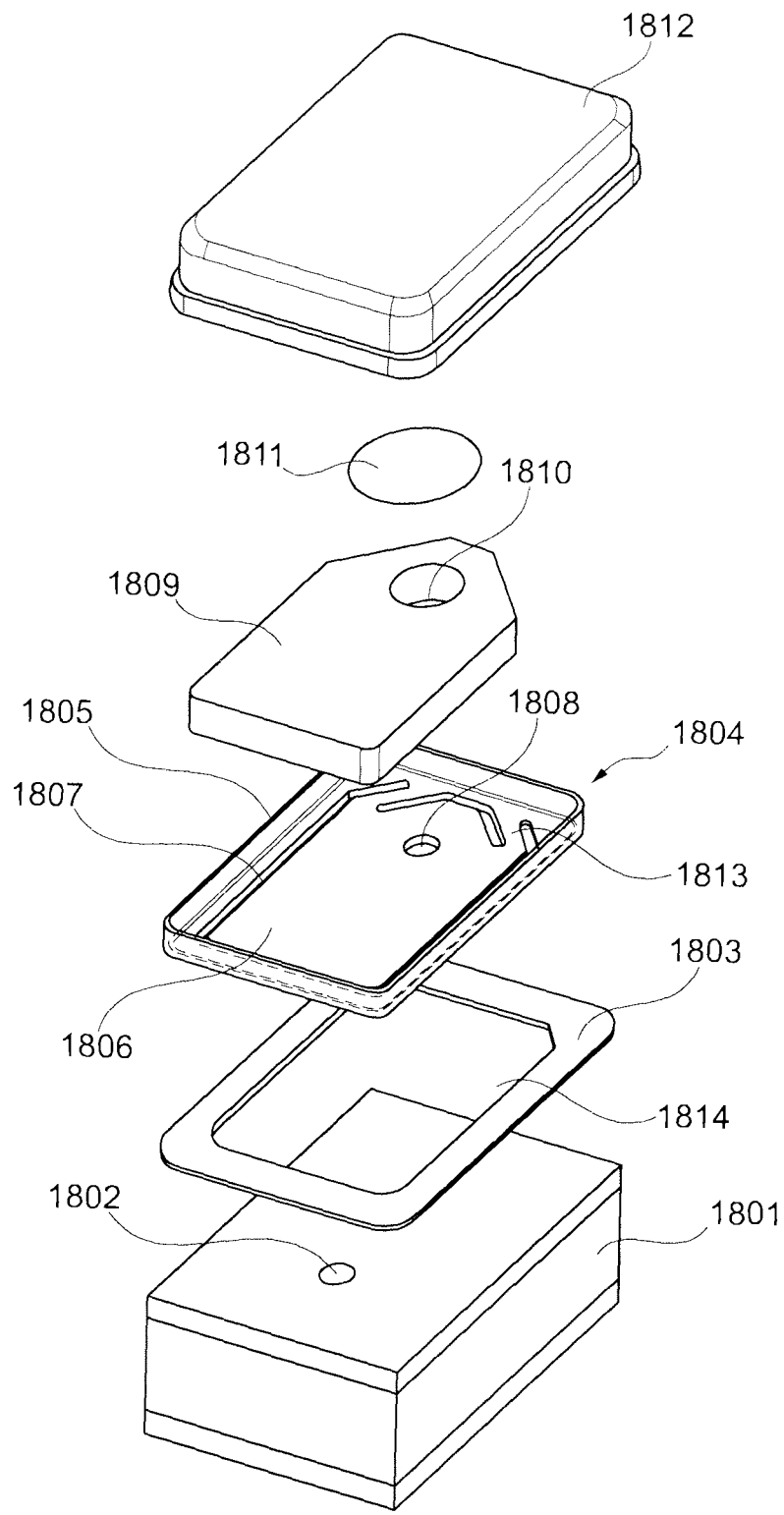
FIG. 18 shows an exploded view of a micro-electromechanical transducer.

Turning now to FIG. 18 an exploded view of the micro-electromechanical transducer is depicted. Starting from below the micro-electromechanical transducer comprises a MEMS microphone 1801 having a sound inlet 1802 arranged in an outer surface thereof. As addressed above the MEMS microphone comprises a pressure sensing element and a processing circuit for processing signals from the pressure sensing element. A spacer 1803 having an opening 1814 is provided on top of the MEMS microphone. The main function of the spacer 1803 is to provide a physical offset between a moveable member structure 1804 and the MEMS microphone 1801.

As seen in FIG. 18 a moveable member structure 1804 is provided on top of the spacer 1803. The moveable member structure 1804 comprises a frame structure 1805 and a moveable member 1806 being separated by an opening or gap 1807 so that at least part of the moveable member 1806 is allowed to move relative to the frame structure 1805. The moveable member 1806 has an opening 1808 in the form of a compensation hole, and it is suspended in integrated hinges 1813. The moveable member structure 1804 is a one-piece component and it may be made of a metal, such as for example brass, steel, nickel or any other non-magnetic material. The main function of the moveable member 1806 is to hold the moveable mass 1809. The entire moveable structure of the micro-electromechanical transducer is provided by the assembly of the moveable mass 1809, the moveable member 1806 and a viscoelastic substance applied in and around the opening or gap 1807, cf. the detailed description below. Apart from this the moveable member 1806 including its integrated hinges 1813 contributes to the stiffness of the moveable mass system during the transfer of the vibrations.

The moveable mass 1809 is a metal block having a weight of around 6 mg. The moveable mass 1809 is positioned on and secured to the moveable member 1806. The moveable mass 1809 has an opening 1810 in the form of a compensation hole at one of its ends. The opening 1808 of the moveable member 1806 is aligned with the opening 1810 of the moveable mass. The function of the moveable mass 1809 is to increase the sensitivity of the micro-electromechanical transducer. A disc 1811 having a small opening of 10-20 μm covers the compensation hole 1810 so that the small opening is aligned with the compensation hole 1810. This small opening of 10-20 μm in combination with the compensation holes 1808, 1810 are required in order to maintain the pressure balance between the upper and the lower volumes/compliance inside the cover 1812. In additional, the small opening of 10-20 μm plays the role in the height adjustment of the resonance peak. The bigger the opening the lower the resonance peak and vice versa.

Figure 19A:
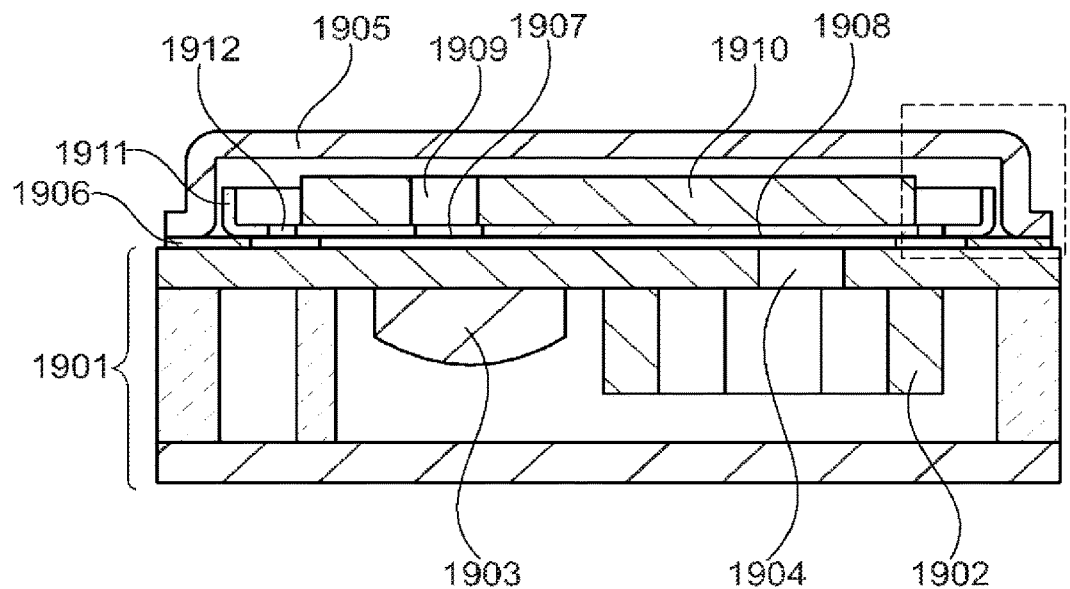
FIGS. 19A and 19B show cross-sectional views of a micro-electromechanical transducer.
Figure 19B:
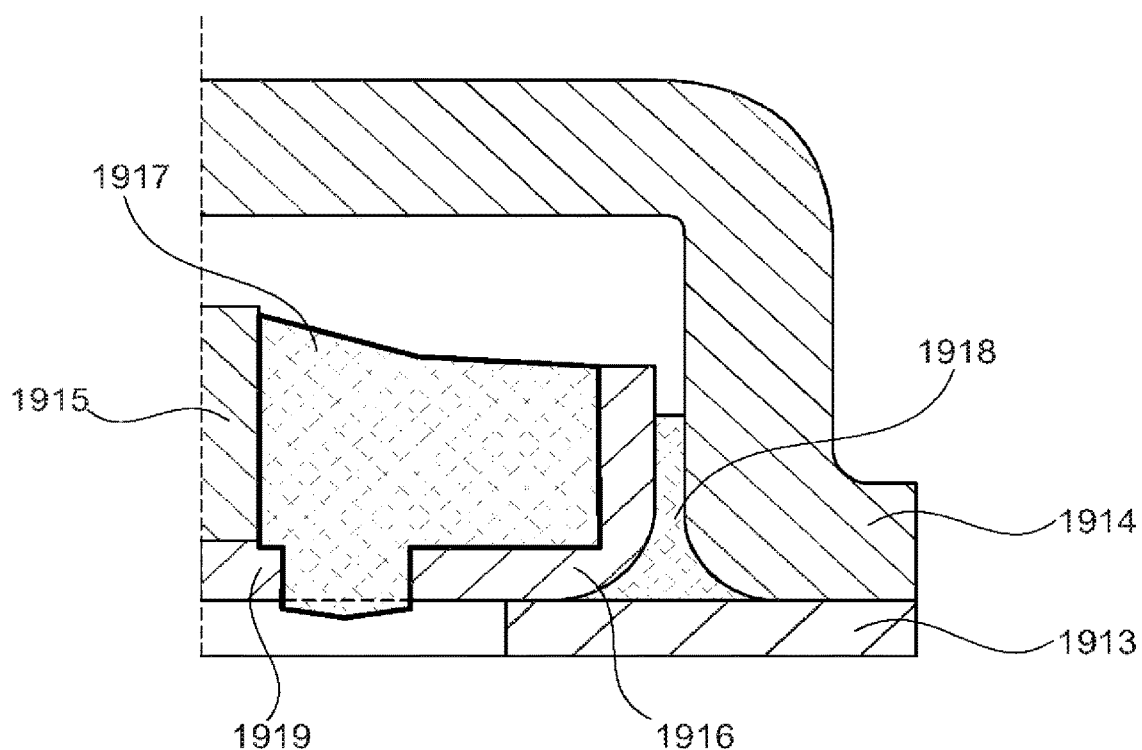

Turning now to FIG. 19 cross-sectional views of the micro-electromechanical transducer are depicted. The cross-sectional view shown in FIG. 19b is a close-up of the region indicated by the dashed line in FIG. 19a. Referring now to FIG. 19a the micro-electromechanical transducer comprises a MEMS microphone 1901 and an add-on assembly comprising a spacer 1906, a moveable member 1908, a moveable mass 1910, a cover 1905 and a proper amount of a viscoelastic substance 1917, cf. FIG. 19b. As previously mentioned the MEMS microphone 1901 comprises a pressure sensing element 1902 and a processing circuit 1903 for processing signals from the pressure sensing element. A sound inlet 1904 is provided so the pressure variations are allowed to enter the MEMS microphone 1901. As previously addressed the moveable member 1908 is at least partly surrounded by an opening or gap 1912 and a frame structure 1911. Moreover, the moveable member 1908 comprises an opening 1907 which is aligned with an opening 1909 in the moveable mass 19010 which is secured to the moveable member 1908. The spacer 1906 facilitates that there is a small volume between the moveable member 1908 and the MEMS microphone 1901. A cover 1905 encapsulates the moveable member 1908, the moveable mass 1910 and the viscoelastic substance 1917, cf. FIG. 19b.

In the close-up figure, i.e. FIG. 19b, the cover 1914, the spacer 1913 and the moveable mass 1915 is depicted. Moreover, the positioning of the viscoelastic substance 1917 is illustrated. As seen, the viscoelastic substance 1917 essentially fills the region between the moveable mass 1915 and the frame structure 1916 of the moveable member structure. Moreover, the viscoelastic substance 1917 completely fills the opening between the frame structure 1916 and the moveable member 1919. The requirement of the viscoelastic substance 1917 is to provide a minimum vibration damping in the acoustic frequency. The viscoelastic substance 1917 must thus have a low stiffness in the acoustic frequency range, i.e. from 20 Hz to 20 kHz. The main function of viscoelastic substance 1917 is to moreover provide an air tight seal between the volume above the moveable member structure, cf. item 1804 in FIG. 18, and the volume below the moveable member structure. The volume above the moveable member structure is limited by the cover 1905 and moveable member structure itself, whereas the volume below the moveable member structure is limited by the spacer 1906, the MEMS microphone 1901 and the moveable member structure itself. FIG. 19b further illustrates that an epoxy glue 1918 is provided between the spacer 1913, the frame structure 1913 and the cover 1914 in order to secured these elements to each other.

During manufacturing the viscoelastic substance is, in its uncured state, kept in position by the vertical wall of the moveable mass 1915 and the frame structure 1916. Surface tension alone is capable of maintaining the viscoelastic substance in the intended position shown in FIG. 19b until it cures. When the viscoelastic substance is cured it forms a suspension member and seal along the opening or gap 1807, cf. FIG. 18.

Figure 20A:
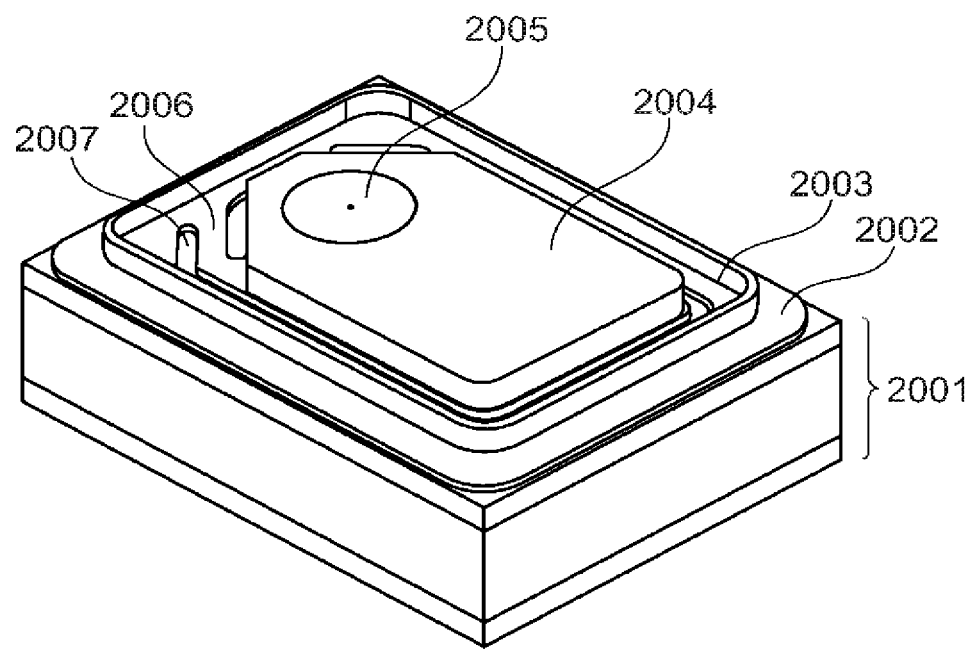
FIGS. 20A and 20B show 3D views of an open micro-electromechanical transducer.

Turning now to FIG. 20a a 3D view of a coverless micro-electromechanical transducer is depicted. As seen the micro-electromechanical transducer comprises the MEMS microphone 2001 onto which the spacer 2002 is secured. The moveable member structure comprising the frame structure 2003, the opening or gap 2007 and the hinge 2006 is secured to the spacer 2002. The moveable member of the moveable member structure is covered by the moveable mass 2004 onto which a disc 2005 having a 10-20 μm opening is secured. The disc 2005 and in particular the opening wherein is aligned with an opening in the form of a compensation hole (not shown) in the moveable mass 2004.

Figure 20B:
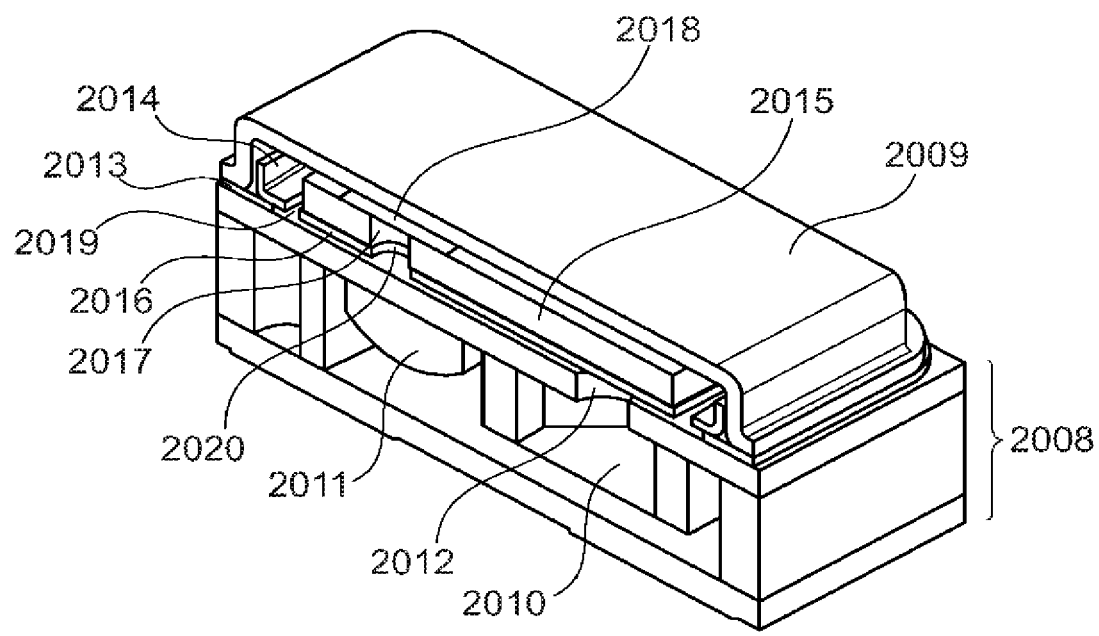

FIG. 20b shows a 3D view and a cross-sectional view of the micro-electromechanical transducer. As addressed above the micro-electromechanical transducer comprises a MEMS microphone 2008 onto which an add-on assembly is secured. The add-on assembly comprises a spacer 2013, a moveable member 2016, a moveable mass 2015, a cover 2009 and a proper amount of a viscoelastic substance (not shown). The MEMS microphone 2008 comprises a pressure sensing element 2010 and a processing circuit 2011. A sound inlet 2012 is provided so the pressure variations are allowed to enter the MEMS microphone 2008. The moveable member 2016 is at least partly surrounded by an opening or gap 2019 and a frame structure 2014. The moveable member 2016 comprises an opening 2020 which is aligned with an opening 2017 in the moveable mass 2015. An 10-20 μm opening in the disc 2018 is aligned with the openings 2017, 2020.

FIG. 21 illustrates various issues that one should be aware of in relation to maintaining the intended position of the viscoelastic substance. With reference to FIG. 21a, which is the preferred implementation, the moveable member 2116 and the horizontal portion of the frame structure is at the same vertical level, i.e. they are not shifted in height. This is the exact implementation also shown in FIGS. 19a, 19b and 20b. In this implementation the viscoelastic substance 2103 does not leak to the underside. To the sides the viscoelastic substance 2103 is kept is position by the vertical walls of the moveable mass 2102 and the frame structure 2101.

Figure 21A:
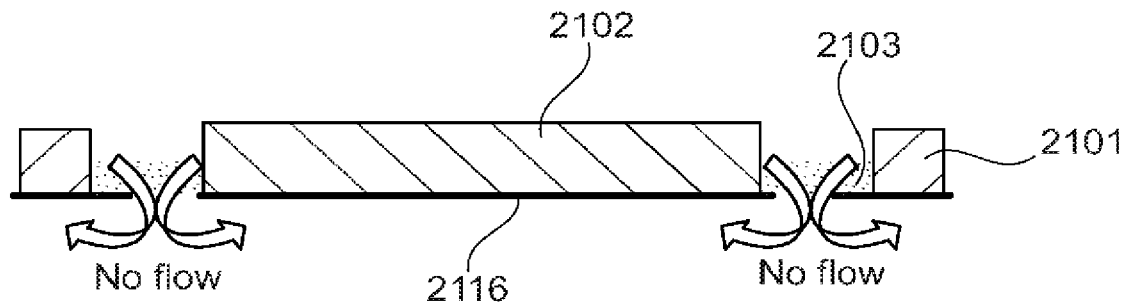
FIGS. 21A, 21B, 21C and 21D show the behaviour of the viscoelastic substance in various scenarios.
Figure 21B:
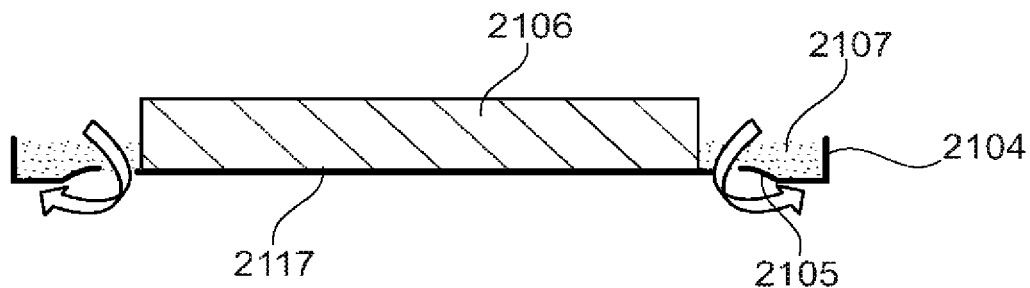
Figure 21C:
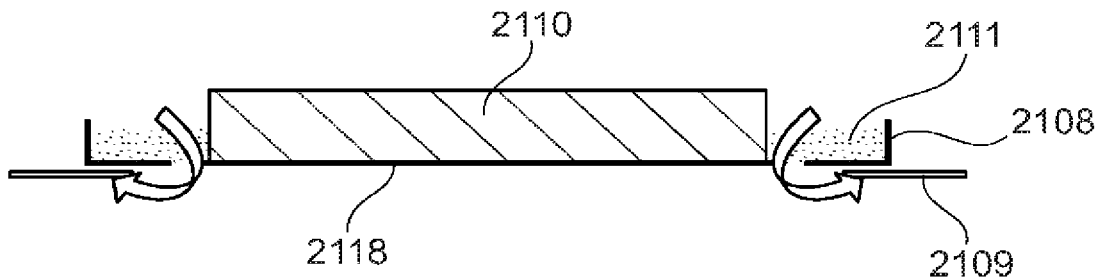
Figure 21D:
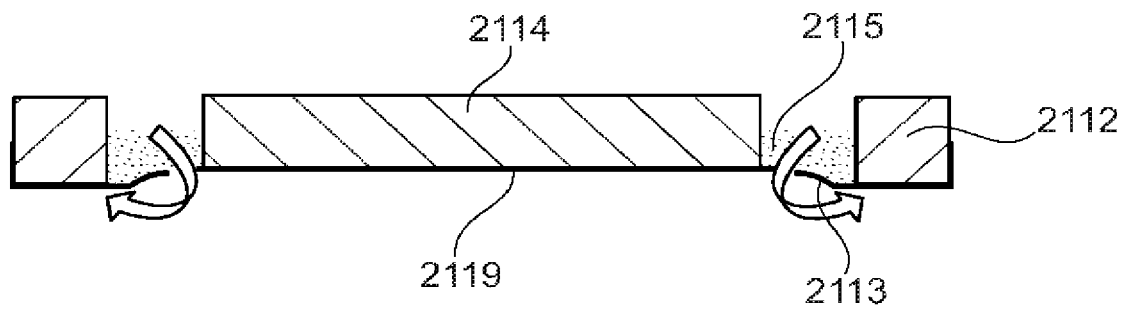

In FIGS. 21b and 21d the moveable members 2117, 2119 are off-set upwards due the angled 2105, 2113 and the horizontal portion of the frame structure is at the same vertical level, i.e. they are shifted in height. The off-set in FIG. 21d is further from the gap compare to the off-set of FIG. 21b. To the sides the viscoelastic substances 2107, 2115 is kept is position by the vertical walls of the moveable masses 2106, 2114 and the frame structure structures 2104, 2112. In both scenarios the viscoelastic substances 2107, 2115 will leak to the underside.

With reference to FIG. 21c the moveable member 2118 and the horizontal portion of the frame structure is again at the same vertical level, i.e. they are not shifted in height. However, the spacer 2109 is closer to the gap compared to the implementation shown in FIG. 21a. In this implementation the viscoelastic substance 2111 will leak to the underside. To the sides the viscoelastic substance 2111 is kept is position by the vertical walls of the moveable mass 2110 and the frame structure 2108.

The invention claimed is:

1. A micro-electromechanical transducer comprising
one or more moveable members including an opening in the form of a compensation hole, a hinged portion, and a free hanging portion,
one or more moveable masses secured to respective ones of the one or more moveable members, and
a reflowable viscoelastic substance having a predetermined viscoelasticity,
wherein each of the one or more moveable masses comprises an opening in the form of a compensation hole being aligned with an opening in the moveable member to which a moveable mass is secured.

2. A micro-electromechanical transducer according to claim 1, wherein the viscoelastic substance is capable of withstanding temperatures of at least 80° C.

3. A micro-electromechanical transducer according to claim 1, wherein the viscoelastic substance is capable of withstanding temperatures of at least 200° C.

4. A micro-electromechanical transducer according to claim 1, wherein the viscoelastic substance is capable of withstanding temperatures of at least 400° C.

5. A micro-electromechanical transducer according to claim 1, wherein the viscoelastic substance has an impedance of at least 100 GΩ.

6. A micro-electromechanical transducer according to claim 1, wherein the Loss Modulus of the viscoelastic substance is larger than 1×102 Pa at 1 kHz.

7. A micro-electromechanical transducer according to claim 1, wherein the stiffness of the viscoelastic substance is less than 50% of the stiffness of the undamped transducer.

8. A micro-electromechanical transducer according to claim 1, wherein the viscoelasticity of the viscoelastic substance is selected so as to damp a resonance peak of the transducer in a predetermined manner.

9. A micro-electromechanical transducer according to claim 1, wherein gaps are provided between the one or more movable members and a frame structure.

10. A micro-electromechanical transducer according to claim 9, wherein the viscoelastic substance is arranged to seal at least part of these gaps.

11. A micro-electromechanical transducer according to claim 9, wherein the viscoelastic substance is arranged to form one or more suspension members for at least one moveable member.

12. A micro-electromechanical transducer according to claim 1, further comprising a read-out arrangement comprising one or more capacitive elements.

13. A micro-electromechanical transducer according to claim 12, wherein the read-out arrangement forms part of a MEMS microphone comprising a pressure sensing element and a processing circuit for processing signals from the pressure sensing element.

14. A micro-electromechanical transducer according to claim 13, wherein the MEMS microphone is a charged plate MEMS microphone.

15. A micro-electromechanical transducer comprising
a MEMS microphone,
an add-on assembly secured to the MEMS microphone, said add-on assembly comprising
a spacer secured to the MEMS microphone,
a moveable member having a frame structure, said frame structure being secured to the spacer,
a moveable mass being secured to the moveable member, said moveable mass comprising an opening in the form of a compensation hole being aligned with an opening in the moveable member,
a viscoelastic substance having a predetermined viscoelasticity, wherein the viscoelastic substance forms a suspension member and a seal between the moveable member and the frame structure, and
a cover secured to the spacer.

16. A micro-electromechanical transducer according to claim 15, wherein the MEMS microphone is a charged plate MEMS microphone.

17. A micro-electromechanical transducer comprising:
one or more moveable members,
one or more moveable masses for influencing the response of the transducer, and
a reflowable damping arrangement,
wherein each of the one or more moveable masses includes an opening in the form of a compensation hole being aligned with an opening in a corresponding one of the one or more moveable members to which the each of the one or more moveable masses is secured.

18. A micro-electromechanical transducer comprising
one or more moveable members, wherein an opening in the form of a compensation hole is provided in the one or more movable members,
one or more moveable masses secured to respective ones of the one or more moveable members, and
a reflowable viscoelastic substance having a predetermined viscoelasticity, wherein each of the one or more moveable masses includes an opening in the form of a compensation hole being aligned with an opening in the moveable member to which a moveable mass is secured.

* * * * *